(12) United States Patent
Hosono et al.

(10) Patent No.: US 11,075,303 B2
(45) Date of Patent: Jul. 27, 2021

(54) OXIDE SEMICONDUCTOR COMPOUND, SEMICONDUCTOR ELEMENT PROVIDED WITH LAYER OF OXIDE SEMICONDUCTOR COMPOUND, AND LAMINATED BODY

(71) Applicants: TOKYO INSTITUTE OF TECHNOLOGY, Meguro-ku (JP); AGC Inc., Chiyoda-ku (JP)

(72) Inventors: Hideo Hosono, Meguro-ku (JP); Toshio Kamiya, Meguro-ku (JP); Hideya Kumomi, Meguro-ku (JP); Junghwan Kim, Meguro-ku (JP); Nobuhiro Nakamura, Chiyoda-ku (JP); Satoru Watanabe, Chiyoda-ku (JP); Naomichi Miyakawa, Chiyoda-ku (JP)

(73) Assignees: TOKYO INSTITUTE OF TECHNOLOGY, Meguro-ku (JP); AGC Inc., Chiyoda-ku (JP)

(*) Notice: Subject to any disclaimer, the term of this patent is extended or adjusted under 35 U.S.C. 154(b) by 0 days.

(21) Appl. No.: 16/117,761

(22) Filed: Aug. 30, 2018

(65) Prior Publication Data
US 2018/0374959 A1    Dec. 27, 2018

Related U.S. Application Data

(63) Continuation of application No. PCT/JP2017/006939, filed on Feb. 23, 2017.

(30) Foreign Application Priority Data

Mar. 2, 2016  (JP) .............................. JP2016-040498

(51) Int. Cl.
*H01L 29/786* (2006.01)
*H01L 51/50* (2006.01)
(Continued)

(52) U.S. Cl.
CPC ........ *H01L 29/78693* (2013.01); *C23C 14/08* (2013.01); *C23C 14/28* (2013.01);
(Continued)

(58) Field of Classification Search
CPC ........... H01L 29/78693; H01L 23/3171; H01L 23/5329; H01L 29/41733; H01L 29/42384;
(Continued)

(56) References Cited

U.S. PATENT DOCUMENTS

2005/0199960 A1   9/2005 Hoffman et al.
2006/0108636 A1   5/2006 Sano et al.
(Continued)

FOREIGN PATENT DOCUMENTS

JE   2012-33854   2/2012
JP   2007-115902  5/2007
(Continued)

OTHER PUBLICATIONS

International Search Report dated May 23, 2017 in PCT/JP2017/006939, filed on Feb. 23, 2017 (with English Translation).
(Continued)

*Primary Examiner* — Dzung Tran
(74) *Attorney, Agent, or Firm* — Oblon, McClelland, Maier & Neustadt, L.L.P.

(57) ABSTRACT

An oxide semiconductor compound includes gallium; and oxygen. An optical band gap is 3.4 eV or more. An electron Hall mobility obtained by performing a Hall measurement at a temperature of 300 K is 3 $cm^2$/Vs or more.

18 Claims, 17 Drawing Sheets

(51) Int. Cl.

| | |
|---|---|
| *C23C 14/08* | (2006.01) |
| *C23C 14/34* | (2006.01) |
| *C23C 14/28* | (2006.01) |
| *C23C 14/58* | (2006.01) |
| *H01B 5/14* | (2006.01) |
| *H01L 23/31* | (2006.01) |
| *H01L 23/532* | (2006.01) |
| *H01L 29/417* | (2006.01) |
| *H01L 29/423* | (2006.01) |
| *H01L 31/04* | (2014.01) |

(52) U.S. Cl.
CPC ...... *C23C 14/3414* (2013.01); *C23C 14/5806* (2013.01); *H01B 5/14* (2013.01); *H01L 23/3171* (2013.01); *H01L 23/5329* (2013.01); *H01L 29/41733* (2013.01); *H01L 29/42384* (2013.01); *H01L 29/7869* (2013.01); *H01L 29/78603* (2013.01); *H01L 51/50* (2013.01); *H01L 31/04* (2013.01)

(58) Field of Classification Search
CPC ........... H01L 29/78603; H01L 29/7869; H01L 51/50; H01L 31/04; C23C 14/08; C23C 14/28; C23C 14/3414; C23C 14/5806; H01B 5/14
USPC .......................................... 257/43
See application file for complete search history.

(56) References Cited

U.S. PATENT DOCUMENTS

| | | | | |
|---|---|---|---|---|
| 2006/0113536 | A1* | 6/2006 | Kumomi | H01L 27/14621 257/57 |
| 2007/0090365 | A1 | 4/2007 | Hayashi et al. | |
| 2007/0194379 | A1* | 8/2007 | Hosono | C23C 14/0021 257/347 |
| 2007/0252147 | A1* | 11/2007 | Kim | H01L 29/7869 257/59 |
| 2009/0072232 | A1* | 3/2009 | Hayashi | H01L 21/28202 257/43 |
| 2011/0001136 | A1 | 1/2011 | Hasegawa et al. | |
| 2011/0012107 | A1 | 1/2011 | Sano et al. | |
| 2011/0042668 | A1* | 2/2011 | Hama | H01L 29/7869 257/43 |
| 2011/0049511 | A1 | 3/2011 | Yano et al. | |
| 2012/0032730 | A1* | 2/2012 | Koyama | G11C 8/04 327/530 |
| 2013/0032798 | A1 | 2/2013 | Miki et al. | |
| 2013/0075720 | A1 | 3/2013 | Ahn et al. | |
| 2013/0214854 | A1 | 8/2013 | Abe et al. | |
| 2013/0327387 | A1* | 12/2013 | Kim | H01L 31/1884 136/256 |
| 2014/0054588 | A1* | 2/2014 | Maeda | H01L 29/7869 257/43 |
| 2014/0183528 | A1* | 7/2014 | Endo | H01L 27/1225 257/43 |
| 2014/0319512 | A1 | 10/2014 | Maeda et al. | |
| 2016/0099353 | A1* | 4/2016 | Yamazaki | H01L 29/7869 257/43 |
| 2017/0170326 | A1* | 6/2017 | Tsubuku | H01L 29/7869 |

FOREIGN PATENT DOCUMENTS

| | | |
|---|---|---|
| JP | 2009-123957 | 6/2009 |
| JP | 2011-66375 | 3/2011 |
| JP | 2012-235104 | 11/2012 |
| JP | 2013-70052 | 4/2013 |
| JP | 5589030 | 9/2014 |
| JP | 2015-109315 | 6/2015 |

OTHER PUBLICATIONS

Written Opinion dated May 23, 2017 in PCT/JP2017/006939, filed on Feb. 23, 2017.
Kim, J., et al. "Realization and Band Alignment in Ultra-wide Bandgap Amorphous Semiconductors a—Ga—Zn—O", The 63$^{rd}$ JSAP Spring Meeting Koen Yokoshu, 2016, 1 page.

* cited by examiner

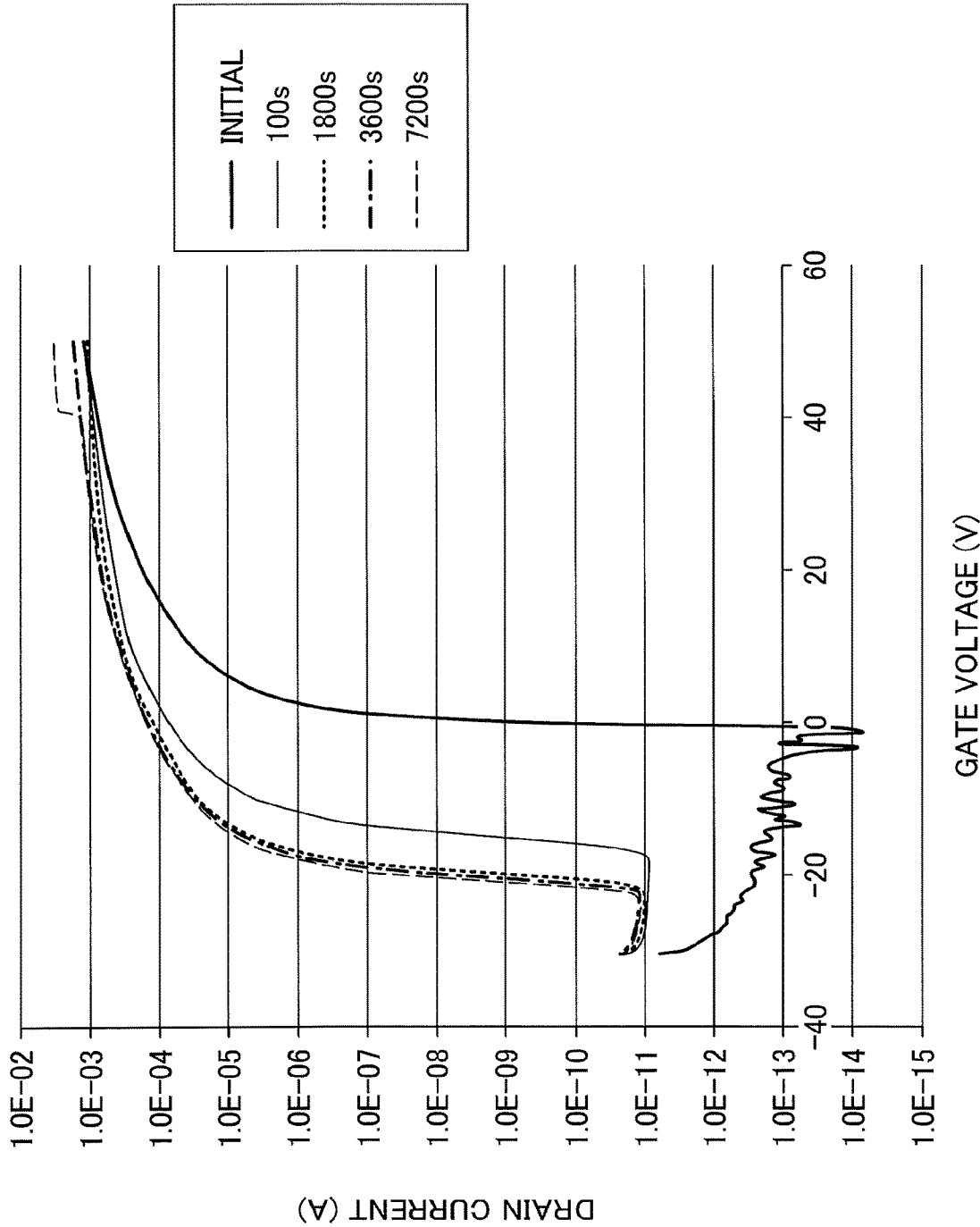

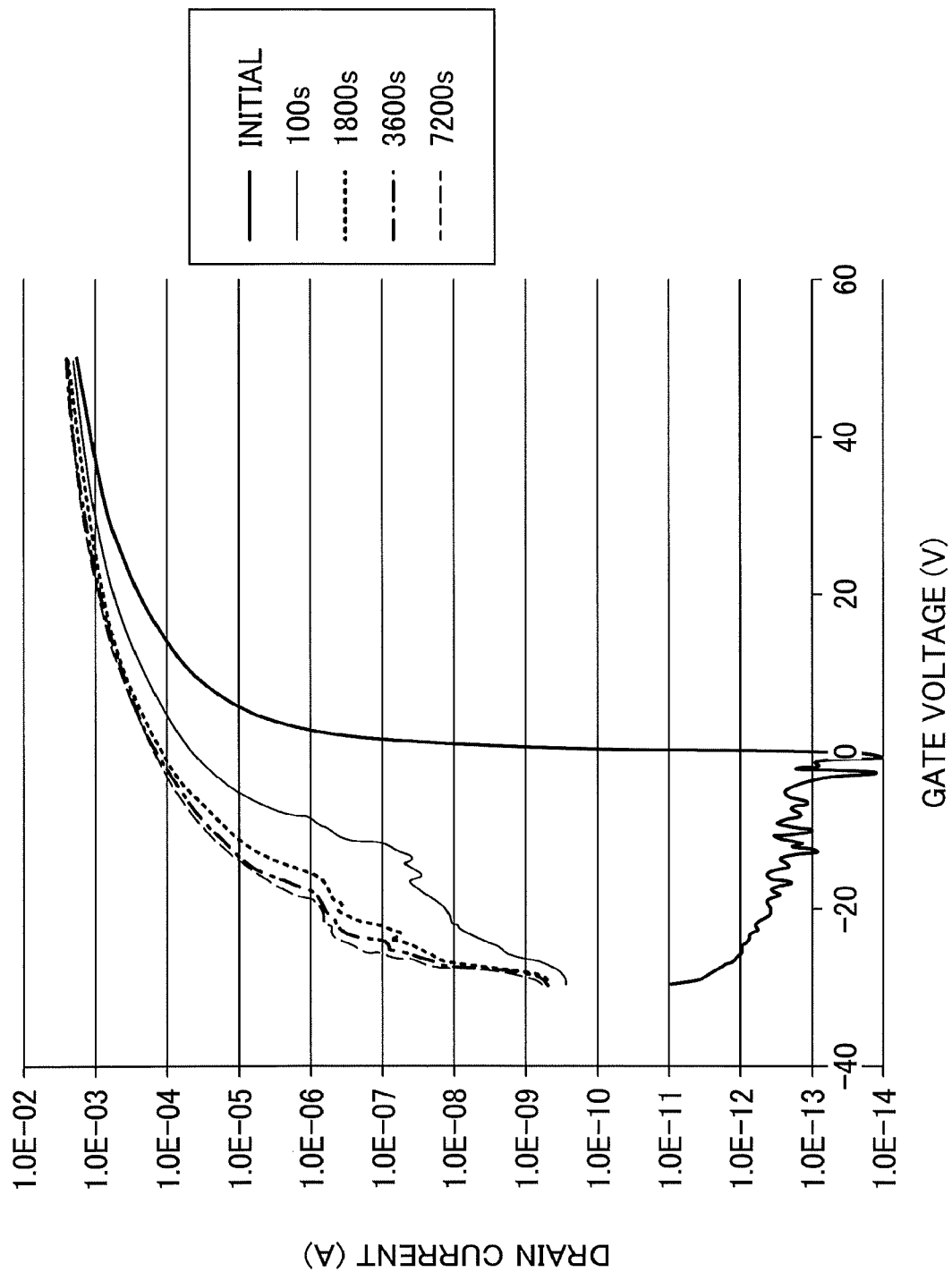

OXIDE SEMICONDUCTOR COMPOUND, SEMICONDUCTOR ELEMENT PROVIDED WITH LAYER OF OXIDE SEMICONDUCTOR COMPOUND, AND LAMINATED BODY

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2017/006939 filed on Feb. 23, 2017 and designating the U.S., which claims priority of Japanese Patent Application No. 2016-040498 filed on Mar. 2, 2016. The entire contents of the foregoing applications are incorporated herein by reference.

BACKGROUND OF THE INVENTION

1. Field of the Invention

The disclosure herein generally relates to an oxide semiconductor compound, a semiconductor element provided with a layer of an oxide semiconductor compound, and a laminated body.

2. Description of the Related Art

Conventionally, for example, silicon has been widely used as a semiconductor material in a semiconductor element such as a TFT (Thin-Film Transistor).

Recently, it has become known that, among oxide semiconductors including metallic cations, there are compounds with relatively broad optical band gaps and relatively great mobilities, and such oxide semiconductors have been applied to semiconductor elements.

Among the aforementioned compounds, oxide semiconductors, such as ZnO and In-G-Zn—O, are transparent and have characteristics comparable to an amorphous silicon or a low-temperature polysilicon. Applications of the oxide semiconductors to next generation TFTs have attracted attention (See, for example, Japanese Patent No. 5589030).

SUMMARY OF THE INVENTION

Technical Problem

As described above, oxide semiconductor compounds are expected to be applied to semiconductor elements as a material to replace silicon.

In the case of using the oxide semiconductors for driving elements of liquid crystal panels, the driving elements may be radiated with an external light including a visible light or an ultraviolet light from a backlight. Moreover, in the case of using the oxide semiconductors for driving elements of OLED (organic light emitting diode) panels, the driving elements may be radiated with an emitted light. It is known that under such a state, in oxide semiconductors, such as In—Ga—Zn—O, leak currents may increase, and failures such as a low contrast of the liquid crystal panel or the OLED panels may occur. Thus, such oxide semiconductors are required to be used with a light shielding layer for shielding light in the semiconductor element (See, for example, Japanese Unexamined Patent Application Publication No. 2007-115902).

If such a variation in characteristics of the oxide semiconductor, under such an environment of irradiation with light, can be controlled, it becomes unnecessary to arrange the light shielding layer, and a degree of freedom of the configuration of the semiconductor element including such an oxide semiconductor, is expected to be dramatically enhanced.

The present invention was made in view of the aforementioned background, and mainly aims at providing an oxide semiconductor compound, in which an occurrence of a leak current due to the aforementioned irradiation with light can be controlled significantly. Moreover, the present invention aims at providing a semiconductor element provided with a layer of such an oxide semiconductor compound, and a laminated body.

Solution to Problem

An aspect of the present invention, an oxide semiconductor compound including gallium and oxygen, an optical band gap being 3.4 eV or more, an electron Hall mobility obtained by performing a Hall measurement at a temperature of 300 K being 3 cm$^2$/Vs, or more, is provided.

When a temperature dependence of an electron density N obtained from the Hall measurement is expressed by the following formula:

$$N = N_0 \exp(-E_a/kT), \qquad \text{formula (1)}$$

$N_0$ may be $10^{16}$ cm$^{-3}$ or more. In the formula (1), T is a measurement temperature (K), k is Boltzmann constant (eVK$^{-1}$), and $E_a$ is an activation energy (eV).

Moreover, in the present invention, a semiconductor element including a layer of an oxide semiconductor compound, the semiconductor element being any one of a TFT (Thin Film Transistor), a photovoltaic cell, and an OLED (Organic light emitting diode), the layer being configured of the oxide semiconductor compound having the aforementioned feature, is provided.

Moreover, in the present invention, a semiconductor element including a layer of an oxide semiconductor compound, the semiconductor element being a TFT (Thin Film Transistor), and the layer including gallium and oxygen, having an optical band gap of 3.4 eV or more, and having a field effect mobility of 5 cm$^2$/Vs or more, is provided.

Furthermore, in the present invention, a laminated body including a substrate; and a layer of an oxide semiconductor compound arranged above the substrate, the layer being configured of the oxide semiconductor compound having the aforementioned feature, is provided.

Effect of Invention

According to an aspect of the present invention, the aforementioned oxide semiconductor compound that can significantly control an occurrence of a leak current due to the irradiation with light can be provided. Moreover, according to an aspect of the present invention, a semiconductor element and a laminated body provided with a layer of such oxide semiconductor compound, can be provided.

BRIEF DESCRIPTION OF THE DRAWINGS

Other objects, features and advantages of the present invention will become more apparent from the following detailed description when read in conjunction with the accompanying drawings, in which:

FIG. 26 is a diagram showing a result of characterization under irradiation with light from the white LED light source, obtained for a fourth TFT element; and FIG. 27 is a diagram showing a result of characterization under irradiation with light from the fluorescent light, obtained for the fourth TFT element.

DETAILED DESCRIPTION OF THE PREFERRED EMBODIMENTS

Figure 1:
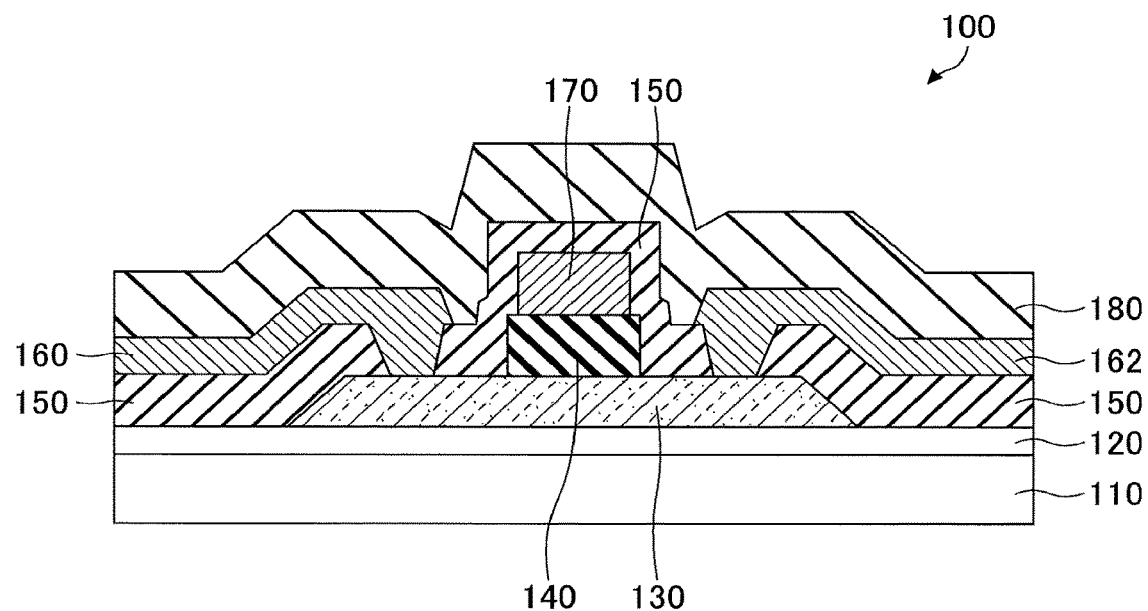
FIG. 1 is a diagram schematically depicting an example of a cross section of a thin film transistor according to an embodiment.

In the following, with reference to drawings, an embodiment of the present invention will be described.

(Oxide Semiconductor Compound According to an Embodiment of the Present Invention)

An embodiment of the present invention provides an oxide semiconductor compound (in the following, referred to as a "first compound"), including gallium and oxygen, with an optical band gap of 3.4 eV or more, and with an electron Hall mobility of 3 cm$^2$/Vs or more obtained from a Hall measurement at a temperature of 300 K.

In the present application, an optical band gap of a material means a value at a room temperature, and is ascertained from the following formula (2):

$$(\alpha h\nu)^{1/2} \propto (h\nu - E_g) \qquad \text{formula (2)}$$

where $\alpha$ is an absorption coefficient, h is Planck's constant, $\nu$ is a frequency of light, and $E_g$ is an optical band gap.

Moreover, an electron Hall mobility and an electron density N can be obtained from a Hall measurement.

Note that a temperature dependence of the electron density N is expressed as formula (1):

$$N = N_0 \exp(-E_a/kT), \qquad \text{formula (1)}$$

where k is Boltzmann constant (eVK$^{-1}$), T is a temperature (K), $N_0$ is a constant, and $E_a$ is an activation energy (eV).

An optical band gap of the first compound is 3.4 eV or more. When the optical band gap is 3.4 eV or more, for an irradiation with visible light, because the optical band gap is greater than a visible light energy, a leak current can be prevented from increasing. The optical band gap is preferably 3.6 eV or more, and further preferably 3.7 eV or more. In the case where the optical band gap is 3.6 eV or more, not only for the irradiation with visible light but also for an irradiation with ultraviolet light, a leak current can be prevented from increasing.

Moreover, the electron Hall mobility is 3 cm$^2$/Vs or more. When the electron Hall mobility is 3 cm$^2$/Vs or more, a number of defect levels in the material is small. Thus, in this case, generation of carriers due to defect levels upon irradiation with light can be controlled, and as a result, a leak current can be prevented from increasing. Moreover, when a semiconductor element is formed, a loss of electric voltage is small. The Hall mobility is more preferably 5 cm$^2$/Vs, further preferably 5.5 cm$^2$/Vs, and especially preferably 6 cm$^2$/Vs.

Moreover, the constant $N_0$ in formula (1) is preferably $10^{16}$ cm$^{-3}$ or more. When the constant $N_0$ is $10^{16}$ cm$^{-3}$ or more, in the case of using oxide semiconductor for a driving element, when a negative electric voltage is applied, under an environment of irradiation with visible light, a threshold electric voltage can be prevented from shifting in a negative direction, and an OFF operation can be performed. The constant $N_0$ is preferably $10^{17}$ cm$^{-3}$ or more, and further preferably $10^{18}$ cm$^{-3}$ or more. In the case where the constant $N_0$ is $10^{18}$ cm$^{-3}$ or more, when a negative electric voltage is applied, under the environment of irradiation with not only visible light but also ultraviolet light, the threshold electric voltage can be prevented from shifting in the negative direction.

The activation energy $E_a$ is preferably 0.04 eV or more. In the case where $N_0$ is $10^{16}$ cm$^{-3}$ or more, by making the activation energy $E_a$ 0.04 eV or more, when a negative electric voltage is applied under the environment of irradiation with visible light, the threshold electric voltage can be prevented from shifting in the negative direction.

The activation energy $E_a$ is preferably 0.10 eV or more, and further preferably 0.15 eV or more. In the case where the activation energy $E_a$ is 0.15 eV or more, when a negative electric voltage is applied, under the environment of irradiation with not only visible light but also ultraviolet light, the threshold electric voltage can be prevented from shifting in the negative direction.

Moreover, when the first compound has a film shape, a film density falls preferably within a range from 5.0 g/cm$^{-3}$ to 5.4 g/cm$^{-3}$. When the film density is 5.0 g/cm$^{-3}$ or more, the first compound is a dense film, and a high Hall mobility can be obtained. Preferably the film density is 5.1 g/cm$^{-3}$ or more, and more preferably 5.2 g/cm$^{-3}$ or more.

An absorption coefficient for an incident light energy of 3.5 eV is preferably 10000 cm$^{-1}$ or less. In the case where the absorption coefficient for the incident light energy of 3.5 eV is 10000 cm$^{-1}$ or less, because a carrier generation due to an optical excitation decreases, a leak current is small. The absorption coefficient for the incident light energy of 3.5 eV is preferably 5000 cm$^{-1}$ or less, and further preferably 1000 cm$^{-1}$ or less.

In the case of applying the aforementioned first compound to a semiconductor element such as TFT, a leak current due to the irradiation with light can be controlled. Moreover, a relatively favorable switching characteristic can be obtained.

Moreover, even when a negative electric voltage is applied, under the environment of irradiation with light, to a semiconductor element provided with the first compound (in the following, such an environment will be referred to as a "negative electric voltage application light irradiation environment"), a variation is unlikely to occur in a voltage-current characteristic of the semiconductor element. Thus, when the first compound is applied to a semiconductor element, an additional layer such as a conventional light shielding layer becomes unnecessary, and a degree of freedom of the configuration can be greatly enhanced.

(Composition of Oxide Semiconductor Compound According to the Embodiment)

Next, an example of a composition of the first compound will be described.

The first compound may include, in addition to gallium, another metallic cation.

The metallic cation may be, for example, at least one of zinc (Zn), indium (In), tin (Sn) and silicon (Si). Among the metallic cations, particularly, zinc is preferable.

Moreover, when the first compound also includes the metallic cation other than gallium, an atomic ratio of gallium atoms to the entirety of metallic cations is preferably 35% or more. When the atomic ratio is 35% or more, for the irradiation with visible light, a leak current can be prevented from increasing. Moreover, a threshold electric voltage is prevented from fluctuating. The atomic ratio of gallium atoms to the entirety of metallic cations is more preferably 50% or more, further preferably 60% or more, and especially preferably 70% or more. In the case where the atomic ratio is 70% or more, when a negative electric voltage is applied, under the environment of irradiation with not only visible light but also ultraviolet light, a leak current can be prevented from increasing, and a threshold electric voltage can be prevented from shifting in the negative direction. The atomic ratio of gallium atoms to the entirety of metallic cations is preferably 95% or less. In the case where the atomic ratio is 95% or less, when a threshold electric voltage is low before irradiating with light, and a negative electric voltage is applied, under the environment of irradiation with not only visible light but also ultraviolet light, a leak current can be prevented from increasing, and the threshold electric voltage can be prevented from shifting in the negative direction.

Moreover, for example, when the first compound is configured substantially of oxides of gallium and zinc, the threshold electric voltage can be prevented from increasing, and it is preferable. An atomic ratio of gallium atoms to the entirety of metallic cations (i.e. Ga+Zn) preferably falls within a range from 35% to 95%. When the atomic ratio is 35% or more, the threshold electric voltage is low before irradiating with light, and for the irradiation with visible light, a leak current can be prevented from increasing, and the threshold electric voltage can be prevented from fluctuating. In the case where the atomic ratio is 95% or less, the threshold electric voltage can be prevented from increasing, and the high field effect mobility can be maintained; for the irradiation with visible light, a leak current can be prevented from increasing, and the threshold electric voltage can be prevented from fluctuating. The atomic ratio of gallium atoms to Ga+Zn may be 50% or more, and 70% or more. Moreover, the atomic ratio may be 90% or less, and 85% or less.

However, practically, the first compound can include an inevitable material (metal, semiconductor and/or compound) that is not shown in the aforementioned description. Most of the inevitable materials are considered to be mixed into the first compound during a manufacturing process for the first compound. The phrase "configured substantially of oxides of gallium and zinc" means that inevitable materials other than the oxides of gallium and zinc may be included.

Note that, the first compound is an amorphous material or an amorphous state may be dominant. The amorphous material is a material that does not give a sharp peak in the X-ray diffraction measurement. Specifically, the amorphous material has a crystallite diameter (Scherrer diameter) obtained by Scherrer's formula, expressed by formula (3), shown below, which is 6 nm or less. A Scherrer diameter L is expressed by $$L = K\lambda/(\beta \cos \theta) \qquad \text{formula (3)}$$

where K is the Scherrer constant, $\lambda$ is a wavelength of X-ray, $\beta$ is a half width, and $\theta$ is a peak position. For example, when a wavelength of the X-ray is 0.154 nm, the Scherrer constant K is 0.9.

Moreover, the phrase "amorphous state may be dominant" means a state in which an amorphous material is present with a volume percent greater than 50%.

When amorphous material or an amorphous state is dominant in the first compound, an influence from defect level to grain boundary is small, and variations in electric characteristics is small. The first compound may be microcrystals or may have a form in which an amorphous material and microcrystals are mixed.

The term microcrystal means a crystal having a Scherrer diameter greater than 6.0 nm and less than 100 nm. When the first compound is microcrystals, an electrical conductivity is enhanced, and is preferable. When the first compound has the form, in which an amorphous material and microcrystals are mixed, both smoothness and an electrical conductivity are enhanced, and is preferable.

(Example of Application of Oxide Semiconductor Compound According to the Embodiment)

The first compound having the aforementioned features can be applied to a variety of semiconductor elements, such as a thin-film transistor (TFT), a photovoltaic cell, and an organic light emitting diode (OLED). In the following, with reference to the drawings, an example of such a semiconductor element will be specifically described.

(Thin Film Transistor)

FIG. 1 is a diagram schematically depicting an example of a cross section of a thin film transistor according to the embodiment (in the following, referred to as a "first element").

As illustrated in FIG. 1, the first element 100 is configured by arranging on a substrate 110, a barrier film 120, an oxide semiconductor layer 130, a gate insulation film 140, an interlayer insulation film 150, a first electrode (source or drain) 160, a second electrode (drain or source) 162, a gate electrode 170, and a passivation film 180.

The substrate 110 is an insulation substrate, such as a glass substrate, a ceramic substrate, a plastic substrate, or a resin substrate. Moreover, the substrate 110 may be a transparent substrate.

The barrier film 120 is arranged between the substrate 110 and the oxide semiconductor layer 130, and has a role of forming a backchannel interface of the substrate 110 and the oxide semiconductor layer 130. The barrier film 120 is configured of silicon oxide, silicon oxynitride, silicon nitride, aluminum oxide and the like. Note that the barrier film 120 is not indispensable. The barrier film 120 may be omitted, if unnecessary.

The gate insulation film 140 is configured of an organic insulation material, such as silicon oxide, silicon oxynitride, silicon nitride, and aluminum oxide. The same applies to the interlayer insulation film 150.

The first and second electrodes 160 and 162, and the gate electrode 170 are configured of a metal, such as aluminum, copper and silver, or other electrically conductive material.

The passivation film 180 has a role of protecting the element, and configured of silicon oxide, silicon oxynitride, silicon nitride, aluminum oxide and the like.

In the first element 100, the oxide semiconductor layer 130 is configured of the first compound having the aforementioned features.

In the conventional TFT, for the oxide semiconductor layer, for example, a compound such as In—Ga—Zn—O has been used.

However, as described above, in the compound, under irradiation with light, a leak current increases. Moreover, in the compound, under the negative electric voltage application light irradiation environment, in addition to the increase of the leak current, the threshold electric voltage may shift in the negative direction. Thus, the OFF operation may not be performed.

Thus, in the conventional TFT, in the configuration illustrated in FIG. 1, when the substrate 110 is transparent, it is necessary to arrange a light shielding layer below the oxide semiconductor layer 130, e.g. between the substrate 110 and the barrier film 120, so that the oxide semiconductor layer 130 is not irradiated with light. Moreover, depending on a size of the gate electrode 170, it is necessary to arrange another light shielding layer also above the oxide semiconductor layer 130, so that the oxide semiconductor layer 130 is not irradiated with light. The light shielding layer means a pattern layer formed of metal or resin, which is not electrically connected to the electrode of the semiconductor element, and shields an incident light.

The conventional TFT has a problem that the arrangement of such a light shielding layer makes the structure of the element complex, makes the manufacturing process of the element complicated, and restricts the degree of freedom of the configuration of the semiconductor element.

In contrast, in the first element 100, to the oxide semiconductor layer 130, the first compound having the aforementioned features is applied. In this case, even when the first element 100 is used under the negative electric voltage application light irradiation environment, the characteristics can be significantly prevented from fluctuating.

Thus, for the first element 100, it becomes unnecessary to add the conventional light shielding layer, and the structure of the element and the manufacturing process can be simplified. Moreover, according to the feature, it is possible to significantly enhance the degree of freedom of the configuration of the first element 100.

In the case where a light with a wavelength of 550 nm enters perpendicularly to the substrate 110 of the first element 100 from below the substrate 110, when an intensity of the incident light is assumed to be 100, an intensity of a reflected light, which is a light transmitted through the substrate 110, the oxide semiconductor layer 130 and the gate insulation film 140, reflected by the gate electrode 170, and transmitted through the gate insulation film 140, the oxide semiconductor layer 130 and the substrate 110, is preferably 60 or more. The intensity of the reflected light is more preferably 65 or more, and further preferably 70 or more.

In the first element 100, the field effect mobility and the threshold electric voltage of the oxide semiconductor layer 130 are obtained by the following formula (4) in a saturation region of the first element 100:

$$I_d = \alpha \times \mu C_{OX} \times \frac{1}{2}(V_{gs} - V_{th})^2 \qquad \text{formula (4)}$$

where $I_d$ is a drain current, $\mu$ is a field effect mobility, $C_{OX}$ is capacitance per unit area formed by the gate electrode 170 and the oxide semiconductor layer 130, $V_{gs}$ is an electric voltage between the gate electrode 170 and the source electrode, and $V_{th}$ is a threshold electric voltage. A coefficient $\alpha$ is, for example, expressed as W/L where a length of a region of the oxide semiconductor layer 130, in which an electric current flows, is L, and a width of the region is W.

The field effect mobility is, similarly to the aforementioned Hall mobility, proportional to a velocity of a carrier in a constant electric field, and the field effect mobility and the Hall mobility correlate with each other. When the field effect mobility is 5 cm²/Vs or more, a number of defect levels in a material is small. Thus, in this case, generation of carriers due to defect levels upon irradiation with light can be controlled, and as a result, a leak current can be prevented from increasing. Moreover, when a semiconductor element is formed, a loss of electric voltage is small.

Moreover, when the field effect mobility of the oxide semiconductor layer 130 is 5 cm/Vs or more, the electron Hall mobility obtained by a Hall measurement for the oxide semiconductor layer 130 at 300 K is 3 cm²/Vs or more.

The field effect mobility of the oxide semiconductor layer 130 is preferably 5.0 cm$^2$/Vs or more. In the case where the optical band gap of the oxide semiconductor layer 130 is 3.4 eV or more, and the field effect mobility is 5.0 cm$^2$/Vs or more, a leak current can be prevented from increasing under the light irradiation environment or the negative electric voltage application light irradiation environment. The field effect mobility is preferably 6.0 cm$^2$/Vs or more, and more preferably 8.0 cm$^2$/Vs or more.

The threshold electric voltage is preferably 20 V or lower. For example, when the gate insulation film is configured of SiO$_x$ with a film thickness that falls within a range from 75 nm to 150 nm, the threshold electric voltage is 20 V or lower.

In the case where the optical band gap of the oxide semiconductor layer 130 is 3.4 eV or more, the gate insulation film is configured of SiO$_x$, and the film thickness of the gate insulation film falls within a range from 75 nm to 150 nm, by making the threshold electric voltage lower than or equal to 20 V, a leak current can be prevented from increasing and the threshold electric voltage can be prevented from shifting in the negative direction, under the light irradiation environment or the negative electric voltage application light irradiation environment.

In order to acquire the aforementioned effects, the threshold electric voltage is preferably 20 V or lower, and more preferably 10 V or lower. Moreover, an ON/OFF ratio is preferably 10$^8$ to 10$^{10}$. When the ON/OFF ratio is 10$^8$ or more, a screen of cross talk is suppressed on a liquid crystal panel or an OLED panel. The ON/OFF ratio is more preferably 10$^9$ or more.

The oxide semiconductor layer 130 is prepared by using a pulsed laser deposition method, or a sputtering method. When the aforementioned method is used, a film with a small number of defects can be obtained, a carrier can be generated even in a deep donor level, the threshold electric voltage becomes 20 V or lower, and the field effect mobility falls within a range from 5.0 cm$^2$/Vs to 8.0 cm$^2$/Vs. Additionally, under the light irradiation environment or the negative electric voltage application light irradiation environment, a carrier due to defect level can be prevented from being generated, and thereby the leak current can be prevented from increasing and the threshold electric voltage can be prevented from shifting in the negative direction.

Note that, in the example of the first element 100, illustrated in FIG. 1, the oxide semiconductor layer 130 is arranged between the substrate 110 and the gate electrode 170.

Figure 2:
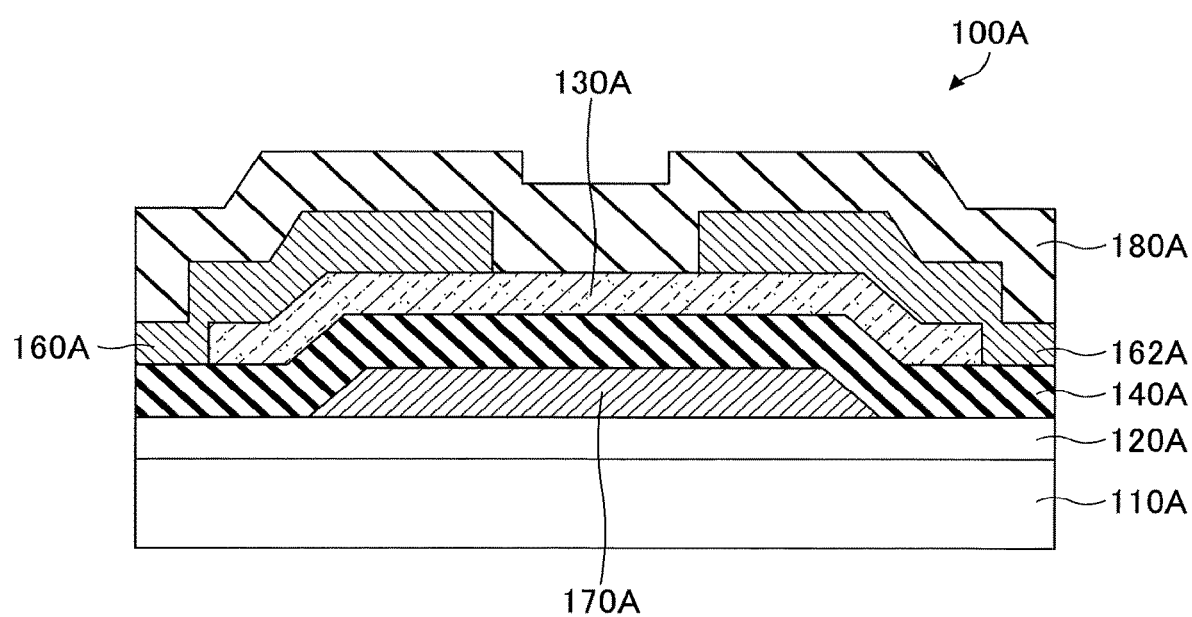
FIG. 2 is a diagram schematically depicting another example of the cross section of the thin film transistor according to the embodiment.

However, as another example of the thin film transistor (TFT), a reverse-staggered configuration, as illustrated in FIG. 2, is considered.

As illustrated in FIG. 2, the TFT 100A is configured by arranging, on a substrate 110A, a barrier film 120A, a gate electrode 170A, a gate insulation film 140A, an oxide semiconductor layer 130A, a first electrode (source or drain) 160A, a second electrode (drain or source) 162A, and a passivation film 180A.

Also in the aforementioned configuration, it is not necessary to shield a part of the oxide semiconductor layer 130A, that is not covered by the first electrode 160A and the second electrode 162A.

In the case where a light with a wavelength of 550 nm enters perpendicularly to the passivation film 180A of the TFT 100A from above the passivation film 180A, when an intensity of the incident light is assumed to be 100, an intensity of a reflected light, which is a light transmitted through the passivation film 180A, the oxide semiconductor layer 130A and the gate insulation film 140A, reflected by the gate electrode 170A, and transmitted through the gate insulation film 140A, the oxide semiconductor layer 130A and the passivation film 180A, is preferably 60 or more. The intensity of the reflected light is more preferably 65 or more, and further preferably 70 or more.

(Manufacturing Method of Thin Film Transistors)

Next, with reference to FIGS. 3 to 8, a manufacturing method of the first element 100, as illustrated in FIG. 1, will be described.

When the first element 100 is manufactured, the substrate 110 is prepared first.

As described above, the substrate 110 may be a transparent insulated substrate, such as a glass substrate, a ceramic substrate, a plastic (e.g. polycarbonate or polyethylene terephthalate) substrate, or a resin substrate. The substrate 110 is sufficiently cleansed.

Next, as necessary, a barrier film 120 is formed on one surface of the substrate 110.

The barrier film 120 may be configured of a silicon oxide, a silicon oxynitride, a silicon nitride, aluminum oxide, and the like. Alternatively, as the barrier film 120, a material having an ultraviolet ray absorption function, such as a zinc oxide, may be used. In this case, an ultraviolet ray entering the first element 100 can be absorbed.

A method of forming the barrier film 120 is not particularly limited. The barrier film 120 may be deposited by using various deposition techniques, such as a sputtering method, a pulsed laser deposition method, an atmospheric CVD method, a decompression CVD method, and a plasma CVD method. A film thickness of the barrier film 120 preferably falls within a range from 10 nm to 500 nm.

Note that, as described above, the barrier film 120 is a layer arranged as necessary, and may be omitted.

Next, on the barrier film 120 (or the substrate 110), the oxide semiconductor layer 130 is formed.

The oxide semiconductor layer 130 is configured of the aforementioned first compound. A method of forming the oxide semiconductor layer 130 is not particularly limited. For example, the oxide semiconductor layer 130 may be formed from various deposition techniques, such as a sputtering method, a pulsed laser deposition method, an atmospheric CVD method, a decompression CVD method, and a plasma CVD method.

Note that the deposition of the oxide semiconductor layer 130 may be performed by using the same apparatus used for the deposition of the barrier film 120, and successively with the deposition of the barrier film 120.

A film thickness of the oxide semiconductor layer 130 preferably falls within a range from 10 nm to 90 nm. When the film thickness is 10 nm or more, a sufficient electron accumulation layer can be formed. The film thickness of the oxide semiconductor layer 130 is more preferably 20 nm or more, and further preferably 30 nm or more. When the film thickness of the oxide semiconductor layer 130 is 90 nm or less, an electric voltage consumption in the film thickness direction is negligible. The film thickness of the oxide semiconductor layer 130 is more preferably 80 nm or less, and further preferably 60 nm or less.

Next, the oxide semiconductor layer 130 is subjected to a pattern processing, and a desired pattern of the oxide semiconductor layer 130 is formed.

As a method of the pattern processing, a typical method including a mask deposition method, a lift off method and the like may be employed. Moreover, after depositing the oxide semiconductor layer 130, a resist pattern having an island shape may be arranged above the oxide semiconductor layer 130, and the oxide semiconductor layer 130 may be etched using the resist pattern as a mask.

In the case of etching the oxide semiconductor layer 130, as an etchant, an aqueous solution of hydrochloric acid, an aqueous solution of EDTA (ethylene diamine tetra acetate), an aqueous solution of TMAH (tetra methyl ammonium hydride) and the like can be applied.

The oxide semiconductor layer 130 is preferably annealed after the pattern processing. An annealing ambience is selected from air, air at reduced pressure, oxygen, hydrogen, nitrogen, an inactive gas, such as argon, helium, and neon, and a water vapor and the like. An annealing temperature preferably falls within a range from 100° C. to 400° C. When the annealing temperature is 100° C. or higher, the field effect mobility of 5 cm$^2$/Vs or more is obtained. When the annealing temperature is 400° C. or lower, the field effect mobility of the oxide semiconductor layer 130 becomes uniform. The annealing temperature is more preferably 350° C. or lower, and further preferably 300° C. or lower.

Figure 3:
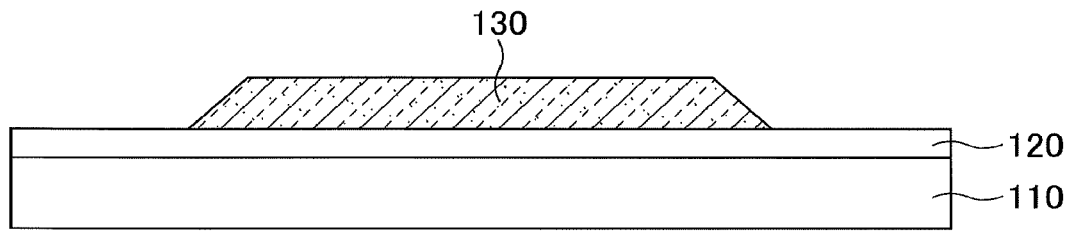
FIG. 3 is a diagram schematically depicting an example of a process upon manufacturing the thin film transistor according to the embodiment.

FIG. 3 is a diagram schematically depicting an example of a state in which on the substrate 110, the barrier film 120, and the patterned oxide semiconductor layer 130 are arranged.

Note that a member in the halfway stage, as illustrated in FIG. 3, i.e. a laminated body having the oxide semiconductor layer 130 on the substrate 110, can be used as intermediates for various apparatuses and elements, in a variety of fields, in addition to the first element 100.

The aforementioned laminated body may or may not be provided with the barrier film 120. The oxide semiconductor layer 130 may or may not be patterned.

Figure 4:
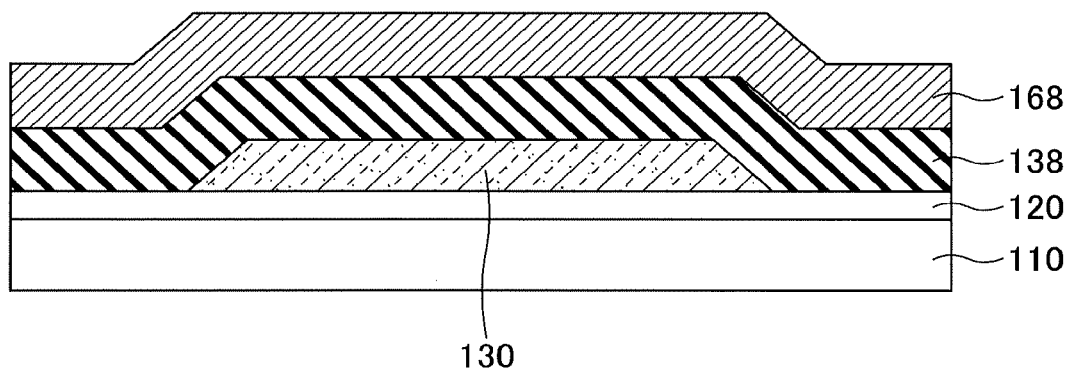
FIG. 4 is a diagram schematically depicting another example of a process upon manufacturing the thin film transistor according to the embodiment.

Next, as illustrated in FIG. 4, above the oxide semiconductor layer 130, an insulation film 138 and a conductive film 168 are arranged.

The insulation film 138 is configured of a material which will be the gate insulation film 140 later. For example, the insulation film 138 may be configured of a silicon oxide, a silicon oxynitride, a silicon nitride, aluminum oxide, and the like. The insulation film 138 may be deposited by using deposition techniques, such as a sputtering method, a pulsed laser deposition method, an atmospheric CVD method, a decompression CVD method, and a plasma CVD method.

A thickness of the insulation film 138 preferably falls within a range from 30 nm to 600 nm. When the thickness of the insulation film 138 is 30 nm or more, a short circuit between the gate electrode 170 and the oxide semiconductor layer 130, a short circuit between the gate electrode 170 and the first electrode (source or drain) 160, or a short circuit between the gate electrode 170 and the second electrode (drain or source) 162 is controlled. When the thickness of the insulation film 138 is 600 nm or less, a high ON current is obtained. The thickness of the insulation film 138 is more preferably 50 nm or more, and further preferably 150 nm or more. Moreover, the thickness of the insulation film 138 is more preferably 50 nm or less, and further preferably 40 nm or less.

On the other hand, the conductive film 168 is configured of a material which will be the gate electrode 170 later. For example the conductive film 168 may be configured of chromium (Cr), molybdenum (Mo), aluminum (Al), copper (Cu), silver (Ag), tantalum (Ta), titanium (Ti) or a composite material including the above-described material and/or an alloy thereof. The conductive film 168 may be a laminated film.

Note that in the first element 100, as described above, because the light shielding for the oxide semiconductor layer 130 is not required, a transparent conductive film may be used for the conductive film 168. The transparent conductive film includes, for example, ITO (In—Sn—O), ZnO, AZO (Al—Zn—O), GZO (Ga—Zn—O), IZO (In—Zn—O) and SnO$_2$. The conductive film 168 may be deposited by using the conventional deposition method, such as a sputtering method and a vapor deposition method. Moreover, the insulation film 138 and the conductive film 168 may be deposited by the same deposition apparatus successively.

A film thickness of the conductive film 168 preferably falls within a range of 30 nm to 600 nm. When the film thickness of the conductive film 168 is 30 nm or more, a low resistance is obtained. When the film thickness is 600 nm or less, a short circuit between the conductive film 168 and the first electrode (source or drain) 160, or a short circuit between the conductive film 168 and the second electrode (drain or source) 162 is controlled. The film thickness of the conductive film 168 is more preferably 50 nm or more, and further preferably 150 nm or more. The film thickness of the conductive film 168 is more preferably 500 nm or less, and further preferably 400 nm or less.

Figure 5:
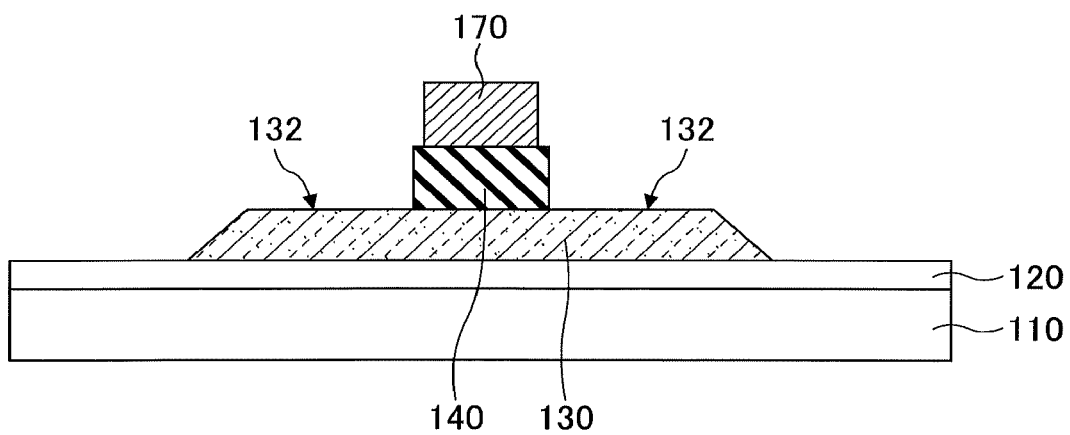
FIG. 5 is a diagram schematically depicting yet another example of a process upon manufacturing the thin film transistor according to the embodiment.

Next, as illustrated in FIG. 5, the insulation film 138 and the conductive film 168 are subjected to the pattern processing, and thereby the gate insulation film 140 and the gate electrode 170 are formed, respectively.

For the pattern processing for the insulation film 138 and the conductive film 168, a method used in a typical TFT array process, i.e. a combination of a photolithography process/etching process, may be employed.

After the pattern processing for the both layers is completed, for a protrusion part 132 (See FIG. 5) protruding from the gate electrode 170 of the oxide semiconductor layer 130, viewed from above, a process of lowering an electric resistance (resistance lowering process) may be performed. The resistance lowering process can be processed, for example, by using a method of performing a hydrogen plasma treatment for the protrusion part 132, a method of implanting hydrogen ions into the protrusion part 132, or the like.

According to the resistance lowering process for the protrusion part 132, an ON resistance for TFT can be reduced.

Next, the interlayer insulation film 150 is formed above the laminated film. The interlayer insulation film 150 may be, as described above, configured of silicon oxide, silicon oxynitride, silicon nitride, aluminum oxide and the like. The interlayer insulation film 150 is deposited by using typical deposition techniques, such as a sputtering method, a pulsed laser deposition method, an atmospheric CVD method, a decompression CVD method, and a plasma CVD method.

Figure 6:
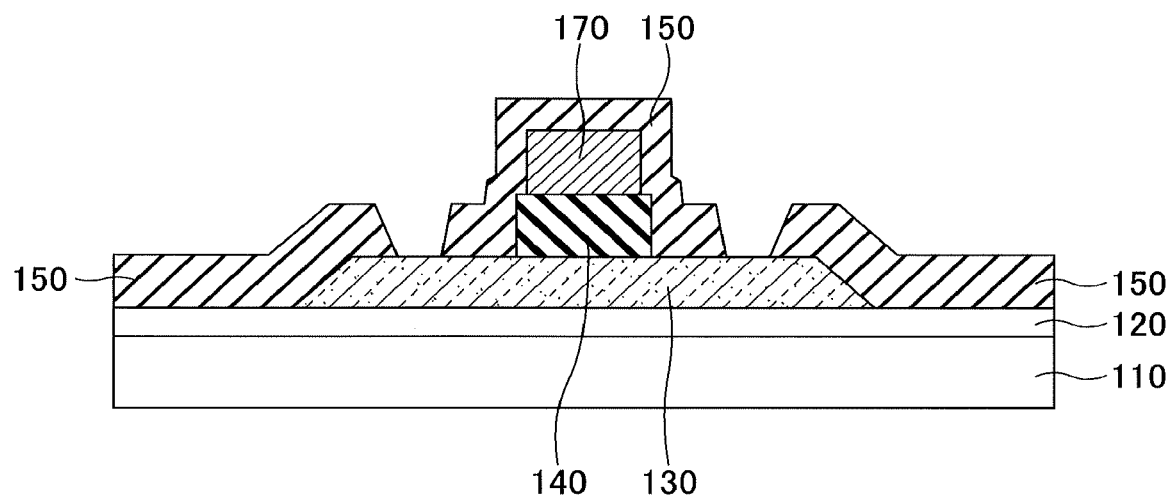
FIG. 6 is a diagram schematically depicting still another example of a process upon manufacturing the thin film transistor according to the embodiment.

Note that, as illustrated in FIG. 6, the interlayer insulation film 150 is subjected to the pattern processing, on both sides of the gate electrode 170 such that parts of the protrusion part 132 of the oxide semiconductor layer 130 are exposed. For the pattern processing for the interlayer insulation film, a typical combination of photolithography process/etching process may be employed.

Figure 7:
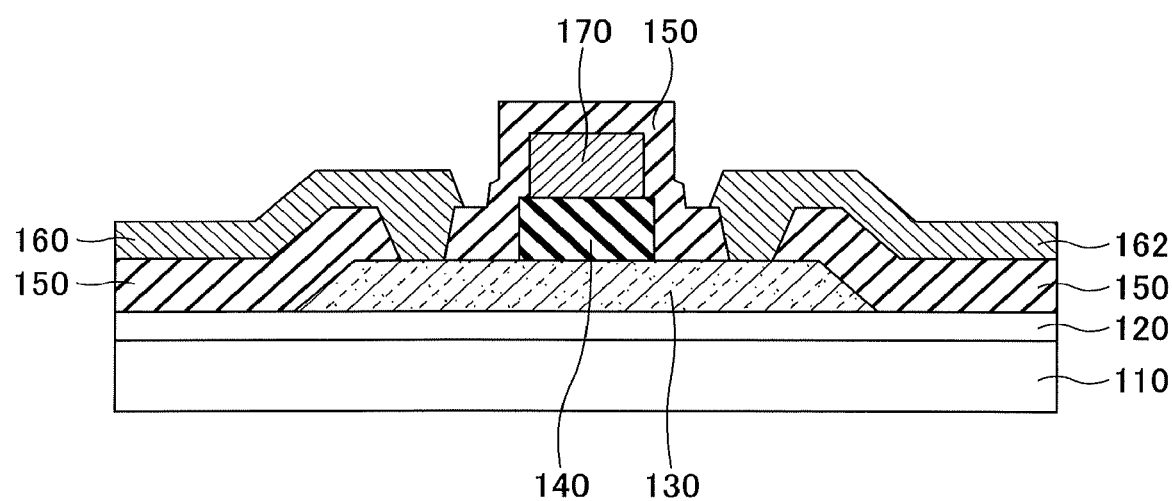
FIG. 7 is a diagram schematically depicting yet another example of a process upon manufacturing the thin film transistor according to the embodiment.

Next, as illustrated in FIG. 7, the first electrode 160 and the second electrode 162 are arranged and patterned. The first electrode 160 and the second electrode 162 are, for example, a drain electrode and a source electrode, respectively, or are the source electrode and the drain electrode, respectively.

The first electrode 160 and the second electrode 162 are arranged and patterned so as to make an ohmic contact with at least a part of the protrusion part 132 of the oxide semiconductor layer 130. For the pattern processing for the first electrode 160 and the second electrode 162, a typical combination of a photolithography process/etching process may be employed.

The first electrode 160 and the second electrode 162 may be configured of chromium, molybdenum, aluminum, copper, silver, tantalum, titanium or a composite material including the above-described material and/or an alloy thereof. Moreover the first electrode 160 and the second electrode 162 may be a laminated film. Alternatively, the first electrode 160 and the second electrode 162 can be transparent conductive films, similarly to the gate electrode 170.

Figure 8:
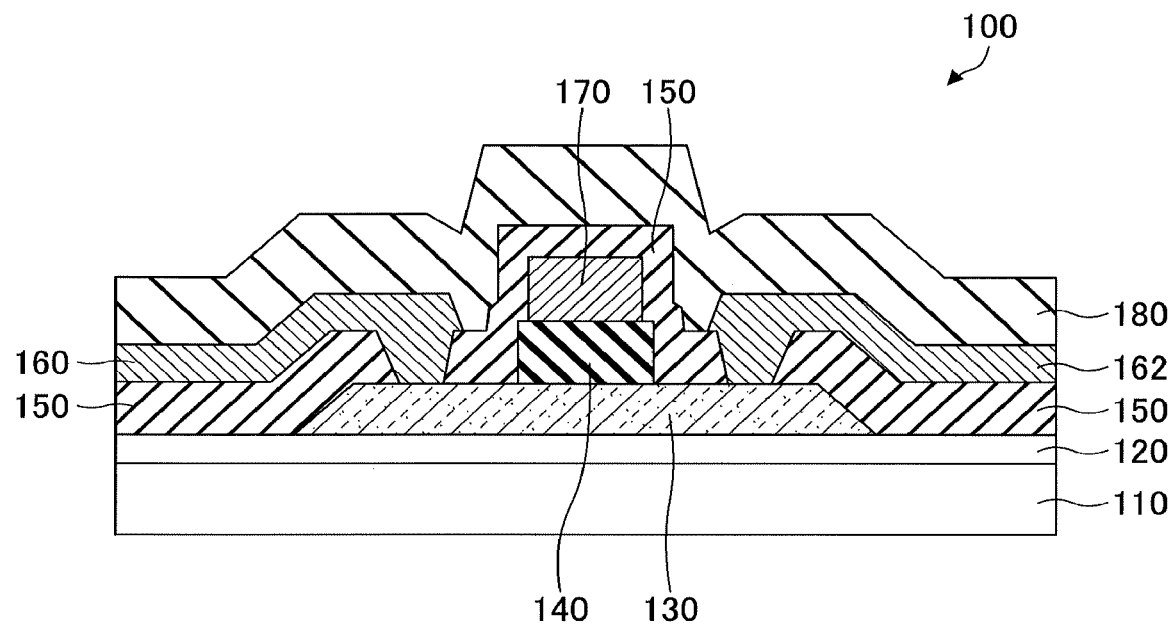
FIG. 8 is a diagram schematically depicting still another example of a process upon manufacturing the thin film transistor according to the embodiment.

Next, as illustrated in FIG. 8, the passivation film 180 is formed so as to cover the laminated films. The passivation film 180 may be configured of silicon oxide, silicon oxynitride, silicon nitride, aluminum oxide, or the like.

The passivation film 180 may be deposited by using deposition techniques, such as a sputtering method, a pulsed laser deposition method, an atmospheric CVD method, a decompression CVD method, and a plasma CVD method.

A thickness of the passivation film 180 preferably falls within a range from 30 nm to 600 nm. When the thickness of the passivation film 180 is 30 nm or more, an exposed electrode can be covered. When the thickness is 600 nm or less, a deflection of the substrate 110 due to a film stress is small. The thickness of the passivation film 180 is more preferably 50 nm or more, and further preferably 150 nm or more. Moreover, the thickness of the passivation film is preferably 500 nm or less, and further preferably 400 nm or less.

According to the aforementioned processes, the first element 100 can be manufactured.

Note that the aforementioned manufacturing method is merely an example, and it is apparent for a person skilled in the art that the first element 100 may also be manufactured by another method. For example, in the case of activating, by the first element 100, a liquid crystal or an organic electroluminescent array, in addition to the aforementioned films, an auxiliary capacitance wiring, a terminal, a current compensation circuit and/or the like may be formed.

(Photovoltaic Cell)

Next, with reference to FIG. 9, a configuration of a photovoltaic cell according to the embodiment will be described.

Figure 9:
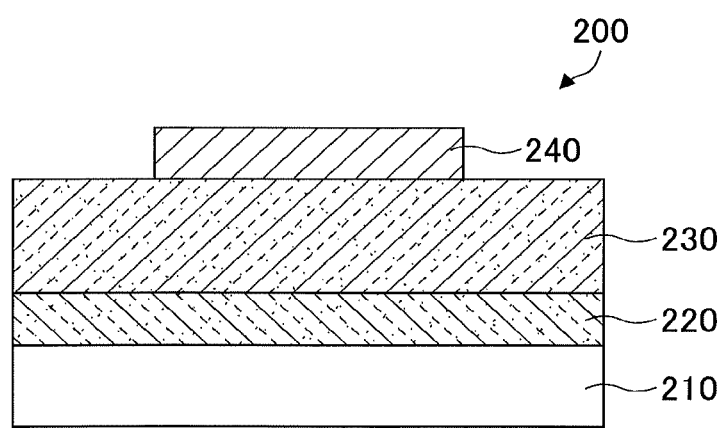
FIG. 9 is a diagram schematically depicting an example of a cross section of a photovoltaic cell according to the embodiment.

FIG. 9 is a diagram schematically depicting a cross section of the photovoltaic cell (in the following, referred to as a "second element") according to the embodiment.

As illustrated in FIG. 9, the second element 200 is configured by arranging, on a support 210, a silicon layer 220, an oxide semiconductor layer 230 and an electrode layer 240.

The support 210 has a role of supporting the respective layers above the support 210. The support 210 may be configured of, for example, a transparent insulated substrate, such as a glass substrate, a ceramic substrate, a plastic (e.g. polycarbonate or polyethylene terephthalate) substrate, or a resin substrate.

The electrode layer 240 is configured of a conductive material such as a metal.

Note that a manufacturing method of the second element 200 can be easily understood by referring to the manufacturing method of the aforementioned first element 100. Thus, a description of the manufacturing method of the second element 200 will be omitted.

In the second element 200, the oxide semiconductor layer 230 is configured of the aforementioned first compound.

Thus, also in the second element 200, the aforementioned effect is obtained, i.e. even when the second element 200 is used under the negative electric voltage application light irradiation environment, the characteristics can be significantly prevented from fluctuating.

(Organic Light Emitting Diode)

Next, with reference to FIG. 10, a configuration of an organic light emitting diode (OLED) according to the embodiment will be described.

Figure 10:
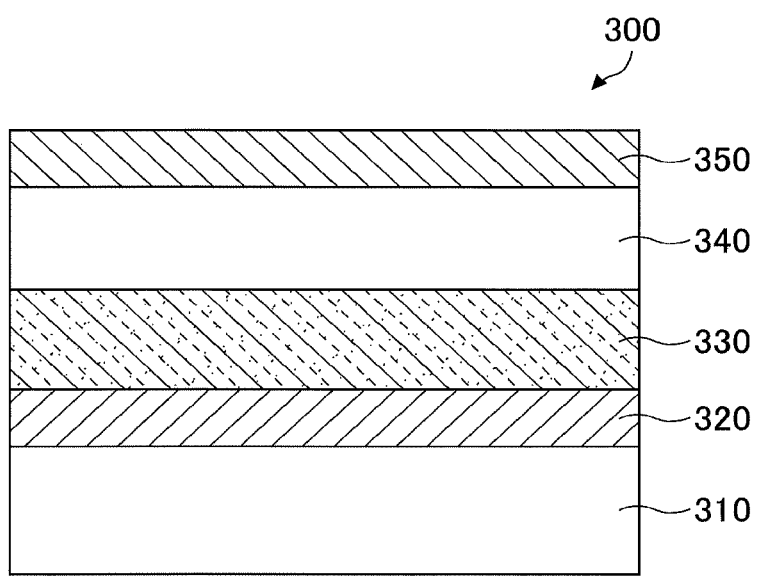
FIG. 10 is a diagram schematically depicting an example of a cross section of an organic light emitting diode according to the embodiment.

FIG. 10 is a diagram schematically depicting a cross section of the OLED (in the following, referred to as a "third element") according to the embodiment.

As illustrated in FIG. 10, the third element 300 is configured by arranging, on a substrate 310, a first electrode (cathode) 320, an oxide semiconductor layer 330, an organic layer 340 and a second electrode (anode), in this order.

The substrate 310 has a function of supporting the respective layers above the substrate 310. The substrate 310 may also be configured of, for example, a transparent insulated substrate, such as a glass substrate, a ceramic substrate, a plastic (e.g. polycarbonate or polyethylene terephthalate) substrate, or a resin substrate.

The oxide semiconductor layer 330 has a function of an electron injection layer or an electron transportation layer.

The organic layer 340 may include, in addition to an organic light emitting layer, an electron injection layer, an electron transportation layer, the organic light emitting layer, a hole transportation layer, a hole injection layer, and the like. However, if unnecessary, the layers other than the organic light emitting layer may be omitted.

Note that, in the example illustrated in FIG. 10, a surface of the third element 300 of the substrate 310 side is a light extraction surface. Thus, the substrate 310 is a transparent substrate, the first electrode 320 is a transparent electrode, and the oxide semiconductor layer 330 is a transparent layer.

Note that a manufacturing method of the third element 300 can be easily understood by referring to the manufacturing method of the aforementioned first element 100. Thus, a description of the manufacturing method of the third element 300 will be omitted.

In the third element 300, the oxide semiconductor layer 330 is configured of the aforementioned first compound.

Thus, also in the third element 300, the aforementioned effect is obtained, i.e. even when the third element 300 is used under the negative electric voltage application light irradiation environment, the characteristics can be significantly prevented from fluctuating.

As described above, the application form of the first compound has been described with examples of a TFT, a photovoltaic cell and an OLED.

However, the aforementioned application form is merely an example. It is clear for a person skilled in the art that the first compound can be applied to other apparatuses or elements. The elements include, for example, a memory element.

EXAMPLE

Next, practical examples of the present invention will be described.

Example 1

(Evaluation of First Film)

By using a method described as follows, an oxide semiconductor compound containing Ga and Zn as cations was deposited, and characteristics thereof were evaluated.

First, pellets for pulsed laser deposition were prepared.

The pellets were prepared as follows: $Ga_2O_3$ powder (by Kojundo Chemical Laboratory Co., Ltd.) and ZnO powder (by Kojundo Chemical Laboratory Co., Ltd.) were weighted so that a cation atomic percent ratio was Ga:Zn=70:30, and the powders were mixed in a mortar. From the mixed powder, green compacts were formed.

The green compacts were baked in atmospheric air and at 1400° C. for five hours, and pellets each having a diameter of 15 mm and a height of 8 mm (in the following, referred to as "first pellets") were obtained.

By using the first pellets, using the pulsed laser deposition method, a thin film was deposited on a substrate. For the substrate, two kinds of substrates, i.e. a glass substrate (AN100, by AGC Inc.) and a quartz glass substrate were used.

The deposition was performed by attaching the first pellet to a pellet holder in a vacuum chamber accommodating the substrate, and irradiating the pellet with a laser pulse. For a laser light, a KrF laser with a wavelength of 248 nm (Complex Pro 110F by Coherent, Inc.) was used. An input power was set to 60 mJ, a repetition frequency was set to 10 Hz. Note that an inside of the chamber was an oxygen atmosphere, and an oxygen partial pressure was set to 5 Pa. A temperature of the substrate was set to 26° C.

According to the above-described configuration, an oxide film including Ga and Zn with a thickness of 150 nm was formed on the substrate.

Afterwards, under a vacuum environment ($3 \times 10^{-3}$ Pa) at 200° C. for an hour, the substrate was annealed. Thus, a glass substrate having an oxide film (in the following, referred to as a "first glass substrate sample"), and a quartz glass substrate having an oxide film (in the following, referred to as a "first quartz glass substrate sample") were obtained.

In order to obtain a ratio of Ga to Zn in the oxide film, a fluorescent X-ray analysis was performed by using the first glass substrate sample. For the analysis, a fluorescent X-ray measurement apparatus (ZSX100e by Rigaku Corporation) was used.

Results of the analysis showed that the ratio of Ga to Zn was the same as a composition of the first pellet. That is, a composition of the oxide film was Ga:Zn=70:30 (atomic ratio). In the following, the oxide film obtained by the aforementioned deposition method will be referred to as a "first film". Note that the composition of the first film is expressed by $Ga_{0.7}Zn_{0.3}O_x$.

Next, a crystallinity and an optical band gap of the first film were evaluated.

The evaluation of the crystallinity was performed by an X-ray diffraction measurement for the first glass substrate sample. For the measurement apparatus, Smart Lab (9 kW) by Rigaku Corporation was used.

Figure 11:
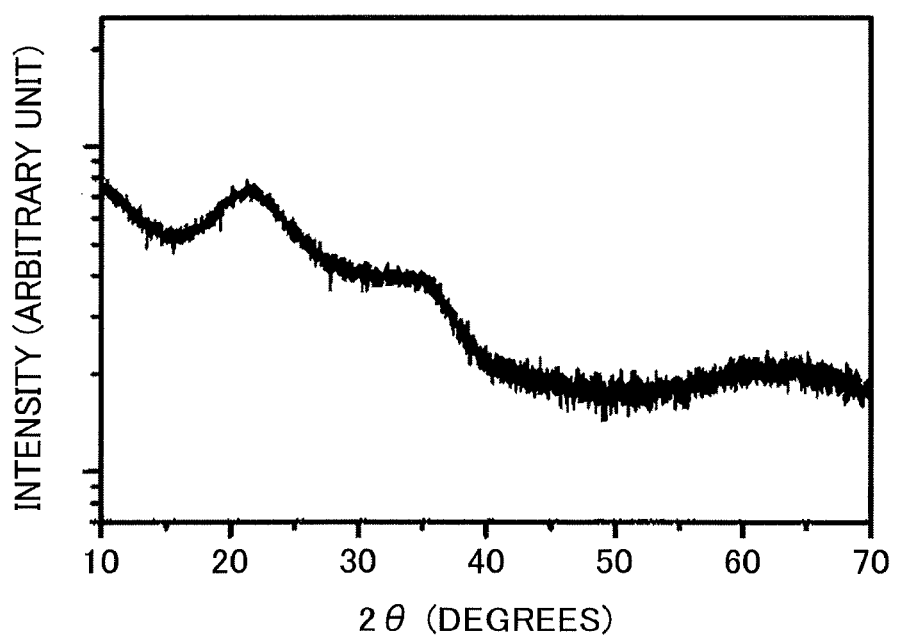
FIG. 11 is a chart showing a result of an X-ray diffraction measurement obtained for a first glass substrate sample.

FIG. 11 shows results of the X-ray diffraction measurement obtained for the first glass substrate sample. From the results, it is found that in the first glass substrate sample, only a broad halo pattern is present. The Scherrer diameter obtained from the aforementioned formula (3) was 1.5 nm, and it was identified that the first film was amorphous.

Next, using the first quartz glass substrate sample, the optical band gap was evaluated.

First, by using a spectrophotometer (U-4100 by Hitachi, Ltd.), a transmissivity T (%) and a reflectance R (%) of the first quartz glass substrate sample were measured.

From the results of measurements, by using the following formula (5), an absorption coefficient $\alpha$ of the first film was calculated:

$$\text{Absorption coefficient } \alpha = -1/d \times \ln(T/(100-R)) \qquad \text{formula (5)}$$

where d is a thickness of a first film contained in the first quartz glass substrate sample. Moreover, an absorption coefficient of the quartz glass substrate is negligibly small.

Figure 12:
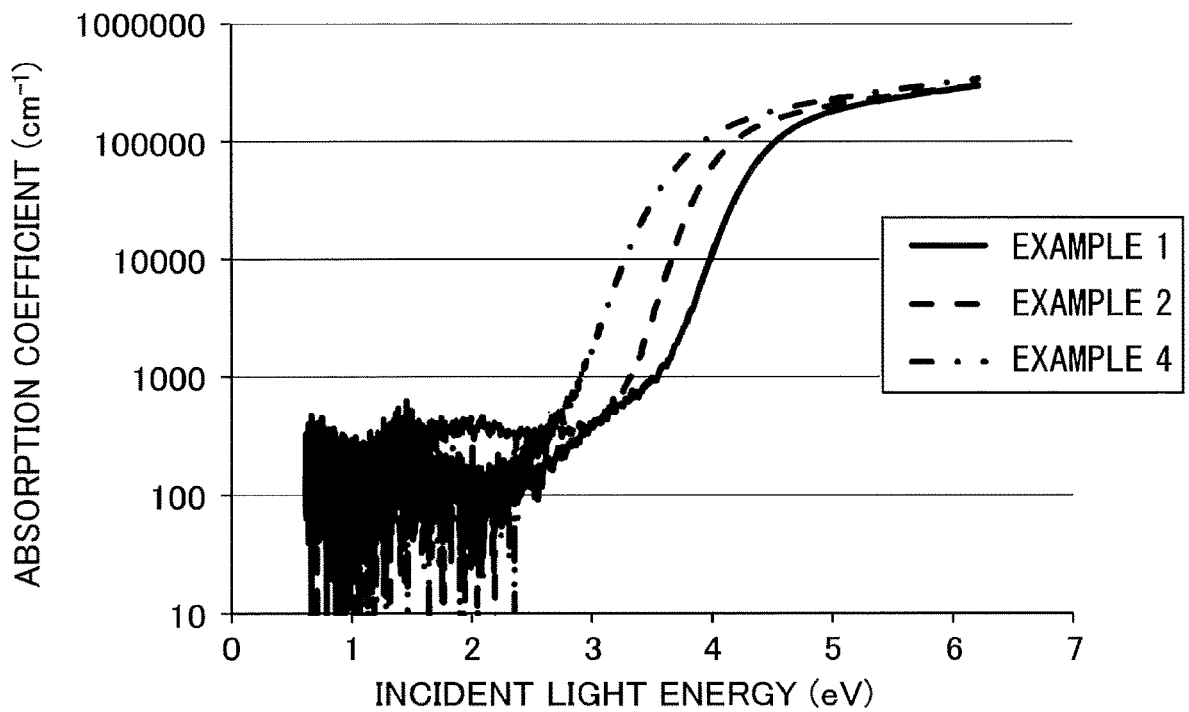
FIG. 12 is a graph showing absorption coefficients for a first film in Example 1, a second film in Example 2, and a fourth film in Example 4.

FIG. 12 shows an absorption coefficient of the first film calculated by using the formula (5). The absorption coefficient of the first film, when the incident light energy was 3.5 eV, was 990 $cm^{-1}$.

When the first film is amorphous, the following formula (6) gives a relation between the absorption coefficient $\alpha$ and an energy of light:

$$(\alpha h\nu)^{1/2} \propto (h\nu - E_g) \qquad \text{formula (6)}$$

where h is Planck's constant, $\nu$ is a frequency of light, and $E_g$ is an optical band gap.

Thus, when a square root of $\alpha h\nu$ has a linear relation to $h\nu$, from the formula (6), the optical band gap of the first film can be calculated. The optical band gap of the first film was 3.76 eV.

Next, by the aforementioned Hall measurement for the first quartz glass substrate sample, a carrier density and a mobility of the first film were evaluated.

Before the Hall measurement, at four corners of the first film of the first quartz glass substrate sample, Al patterns (2 mm×2 mm) with a thickness of 50 nm were formed, and used as electrodes.

For the Hall measurement, a Hall measurement apparatus (ResiTest 8300 by TOYO Corporation) was used.

An intensity of a magnetic field was set to 0.34 T, and for measuring an electric current, an automatically setting mode was used. The measurement was performed for each 10 K within a range from 160 K to 300 K.

Figure 13:
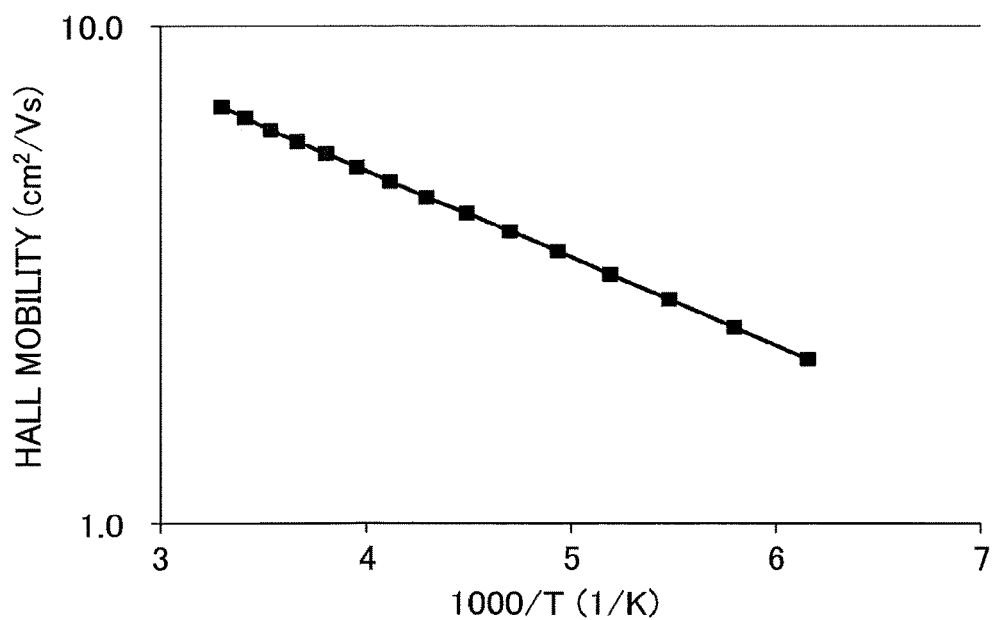
FIG. 13 is a graph showing a temperature dependence of a mobility obtained from the Hall measurement for the first film in Example 1.
Figure 14:
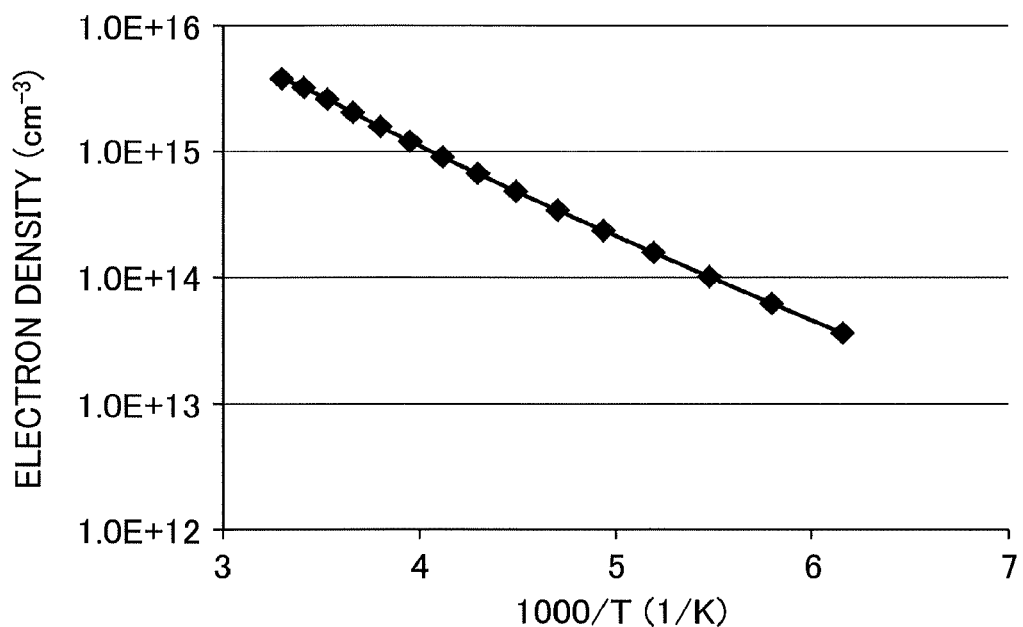
FIG. 14 is a graph showing a temperature dependence of a carrier density obtained from the Hall measurement for the first film in Example 1.

FIG. 13 shows a temperature dependence of a Hall mobility obtained by the Hall measurement. Moreover, FIG. 14 shows a temperature dependence of a carrier density obtained by the Hall measurement. Note that in any case, the carrier was an electron.

From FIG. 13 and FIG. 14, it was found that both carrier (electron) mobility and the carrier (electron) density closely followed the Arrhenius Law. The carrier (electron) mobility at 300 K was 6.9 $cm^2/Vs$.

From the temperature dependence of the carrier (electron) density N, obtained as above, based on the aforementioned formula (1), $N_0$ and the activation energy $E_a$ were obtained. $N_0$ was $1.5 \times 10^{18}$ $cm^{-3}$, and the activation energy was $E_a = 0.16$ eV.

Moreover, using Smartlab by Rigaku Corporation, by an XRR method, a film density of the first film was measured. As a result, the film density was 5.25 $g/cm^3$.

(Preparation of First TFT Sample)

Next, by the following method, a TFT element (in the following, referred to as a "first TFT sample") was prepared.

Figure 15:
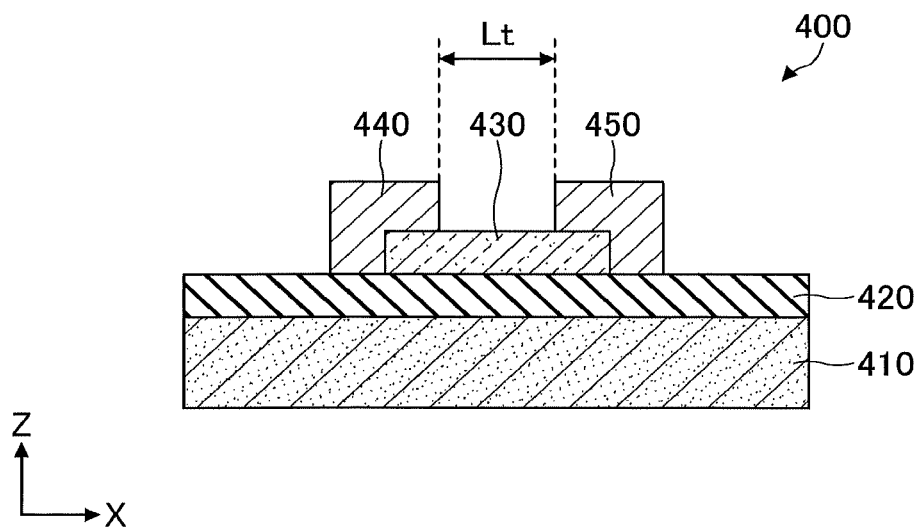
FIG. 15 is a cross section schematically depicting an example of a configuration of a first TFT element.

FIG. 15 is a diagram schematically depicting a cross-sectional configuration of the first TFT sample.

As illustrated in FIG. 15, the first TFT sample 400 includes a silicon substrate 410, a thermal oxidation film 420, an oxide semiconductor layer 430, a drain electrode 440 and a source electrode 450.

For preparing the first TFT sample 400, first, the silicon substrate 410 (13 mm×13 mm) with the thermal oxidation film 420 was provided. The silicon substrate 410 was n-type, and has a specific resistance of 0.001 Ωcm. The thermal oxidation film 420 was formed by oxidizing the silicon substrate 410. A thickness of the thermal oxidation film 420 was 150 nm.

Note that, the silicon substrate 410 was used as a gate electrode of the first TFT sample 400, and the thermal oxidation film 420 was used as a gate insulation film of the first TFT sample 400.

Next, a photoresist was arranged on the thermal oxidation film 420. Moreover, by a typical photolithography method, the photoresist was subjected to a pattern processing. A pattern of the photoresist was set to a shape in which a rectangular through region of 900 μm (vertical)×300 μm (horizontal) (length in the X-direction in FIG. 15) was present at the center.

Next, by a pulsed laser deposition method, using the photoresist as a mask, an oxide semiconductor layer was formed on the thermal oxidation film 420.

The oxide semiconductor was set to be a layer containing oxides of Ga and Zn, and deposited with the deposition condition shown in the aforementioned item (evaluation of first film). However, the thickness of the oxide semiconductor layer was set to 50 nm.

Afterwards, the silicon substrate 410 was immersed in an acetone, and was subjected to an ultrasonic cleansing for five minutes. Furthermore, the silicon substrate 410 was subjected to another ultrasonic cleansing for five minutes in an ethanol. According to the above-described processing, the photoresist and the oxide semiconductor layer deposited on the photoresist were removed. As a result, an oxide semiconductor layer 430 having an island shape was formed at the center of the thermal oxidation film 420.

Next, the silicon substrate 410 was annealed for one hour at 200° C., under the reduced pressure of $3.0 \times 10^{-3}$ Pa.

Next, on the thermal oxidation film 420 and the oxide semiconductor layer 430, the drain electrode 440 and the source electrode 450, having shapes illustrated in FIG. 15, were formed.

The electrodes 440 and 450 were set to be configured of metallic aluminum, and formed by a typical sputtering method using a photoresist pattern, as described above, as a mask.

In the top plan view, dimensions of the drain electrode 440 and the source electrode 450 were set to be 300 μm (vertical)×200 μm (horizontal)(length in the X-direction in FIG. 15)×50 nm (thickness) (maximum). Moreover, a distance Lt between the drain electrode 440 and the source electrode 450 (See FIG. 15) was set to be 50 μm.

Finally, an end surface of the silicon substrate 410 was polished so that a conductive surface was exposed. The exposed surface was set to be an electric conductive part.

According to the aforementioned processes, the first TFT sample 400 was prepared. Note that from the above descriptions, it is clear that the oxide semiconductor layer 430 of the first TFT sample 400 corresponds to the aforementioned "first film".

(Evaluation of First TFT Sample)

Using the first TFT sample 400, prepared as above, a characteristic evaluation under the negative electric voltage application light irradiation environment was performed.

Specifically, in a state where the first TFT sample 400 was irradiated with light from a side opposite to the silicon substrate 410, and a negative electric voltage was applied to the gate electrode (silicon substrate 410), a change in characteristics occurring in the first TFT sample 400 was measured.

For the measurement of the change in characteristics, a semiconductor parameter analyzer (4155C by Agilent Technologies Inc.) was used. For a light source, a white LED light source and a fluorescent light attached to the prober were used. An illuminance of the white LED light source was 11000 lux, and an illuminance of the fluorescent light was 17000 lux.

Figure 16:
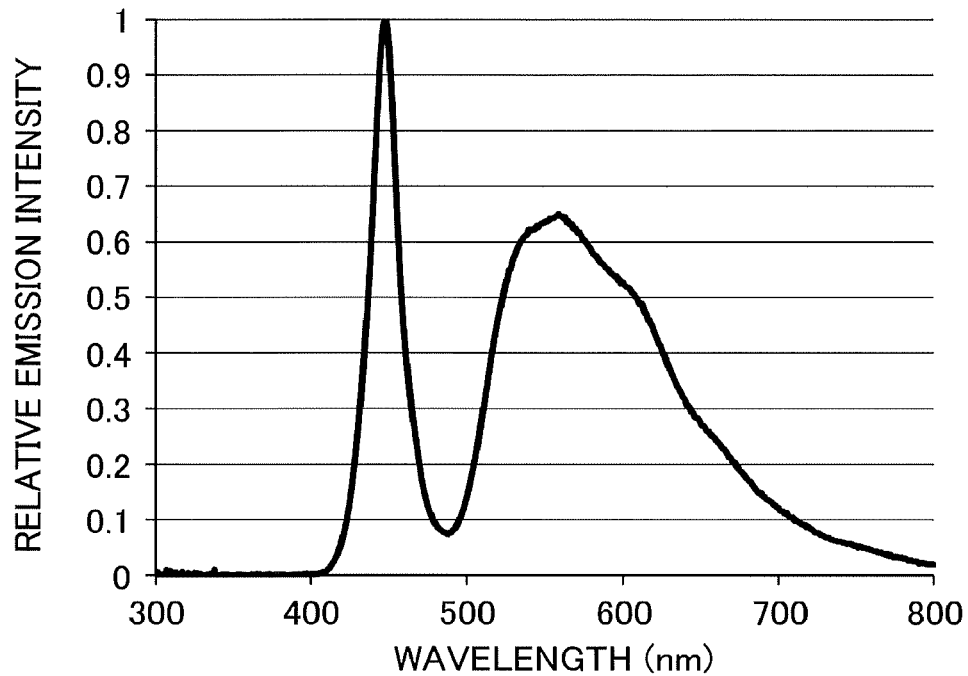
FIG. 16 is a diagram depicting an example of an emission spectrum of a white LED light source used for characterization of the first TFT element.
Figure 17:
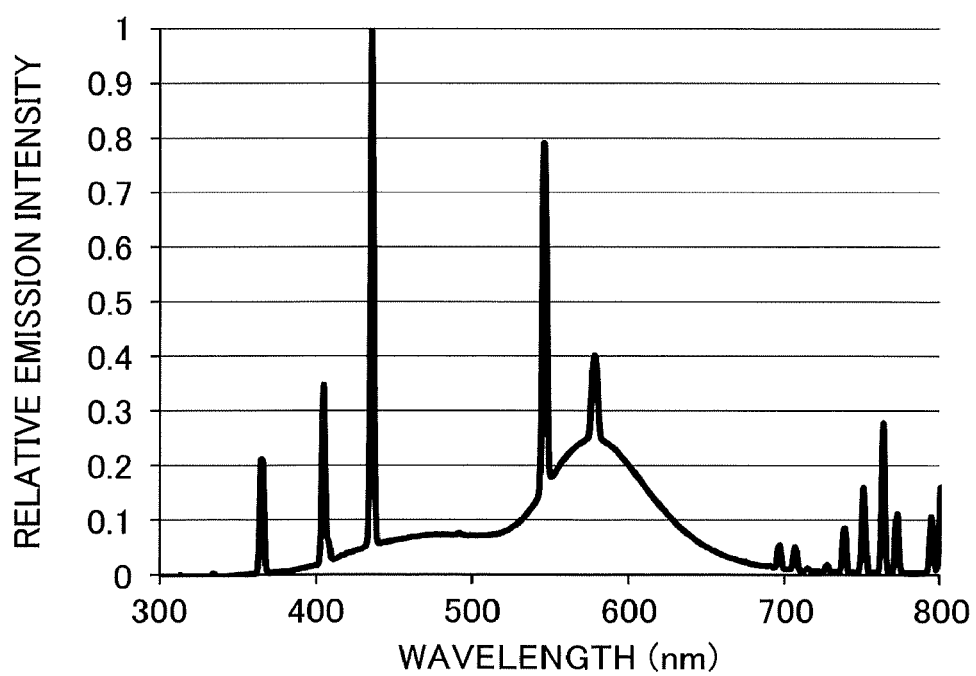
FIG. 17 is a diagram depicting an example of an emission spectrum of a fluorescent light used for characterization of the first TFT element.

FIG. 16 shows an emission spectrum of the white LED light source used for the measurement. Moreover, FIG. 17 shows an emission spectrum of the fluorescent light used for the measurement.

In the evaluation of characteristics, under the irradiation with light from the light source, the gate electrode was set to −20 V, and the drain electrode 440 and the source electrode 450 were set to 0 V. After maintaining the state for a predetermined time period, the TFT characteristics were measured.

Figure 18:
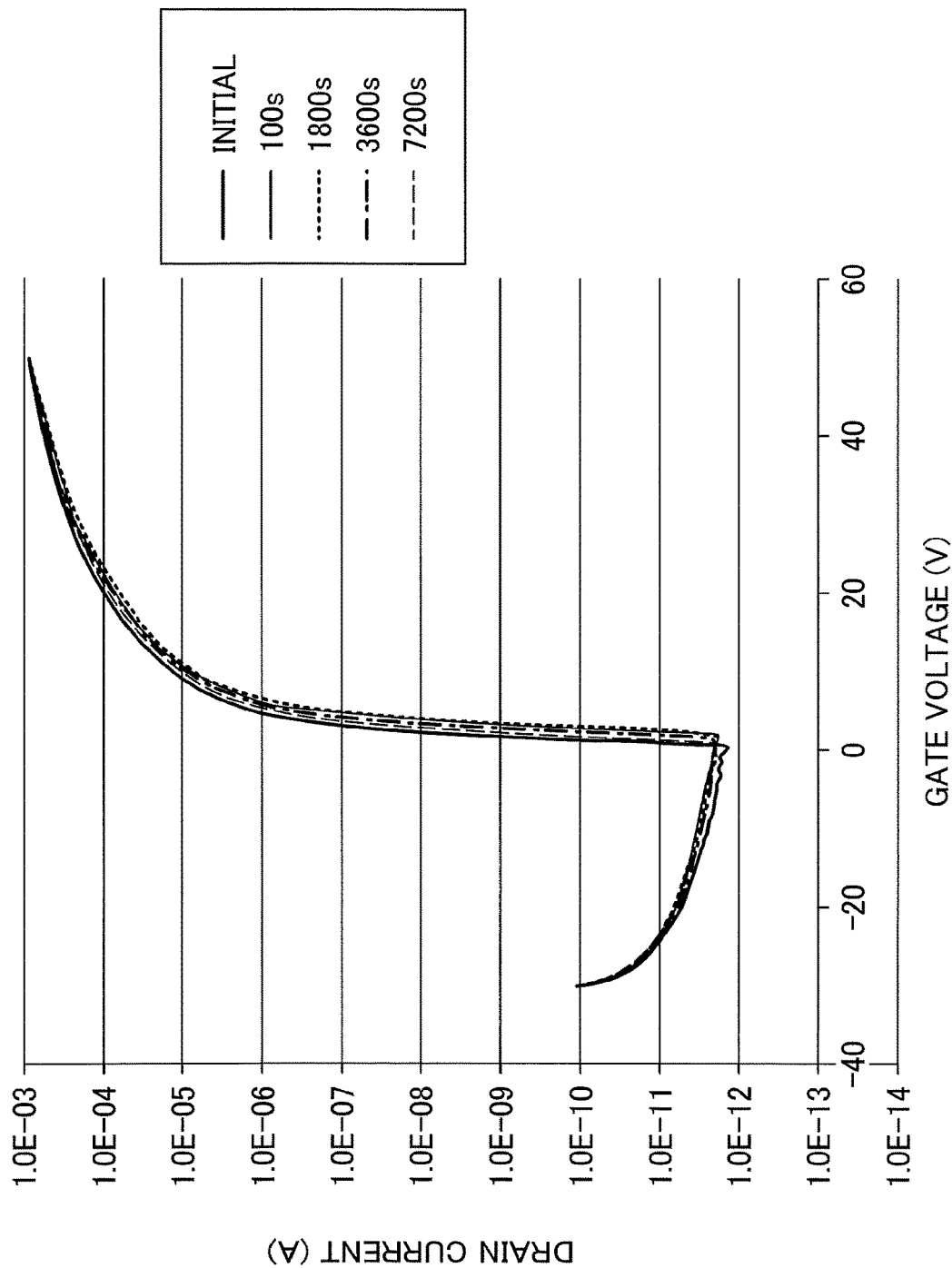
FIG. 18 is a diagram showing a result of the characterization under irradiation with light from the white LED light source, obtained for the first TFT element.
Figure 19:
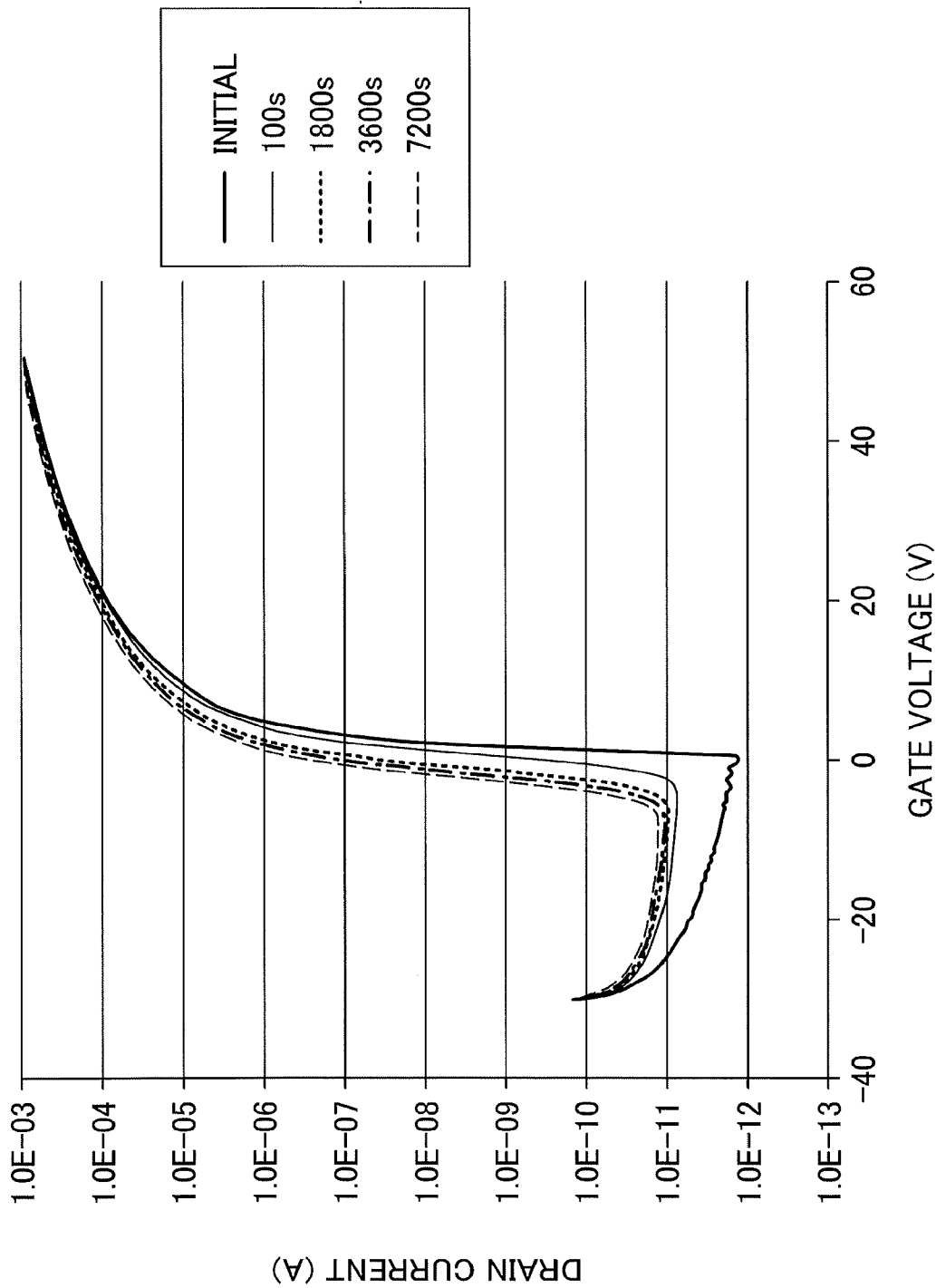
FIG. 19 is a diagram showing a result of the characterization under irradiation with light from the fluorescent light, obtained for the first TFT element.

FIGS. 18 and 19 show results of the evaluation obtained for the first TFT sample 400. FIG. 18 shows results under irradiation with light from the white LED light source, and FIG. 19 shows results under irradiation with light from the fluorescent light.

Note that in the figures, a line denoted by "INITIAL" indicates a measurement result for a dark state, i.e. a state without the irradiation with light.

From FIGS. 18 and 19, it is found that, in the case of the first TFT sample 400 that is provided with the first film as the oxide semiconductor layer 430, even after maintaining for 7200 seconds under the negative electric voltage application light irradiation environment, the characteristics are almost unchanged. Moreover, it is found that the result does not depend on a type of the light source.

In this way, it is confirmed that the characteristics of the first film having a composition expressed by $Ga_{0.7}Zn_{0.3}O_x$ is significantly prevented from fluctuating even under the negative electric voltage application light irradiation environment.

Note that an ON/OFF ratio of the first TFT sample 400 in the dark state was from $10^8$ to $10^9$, the field effect mobility of the oxide semiconductor layer 430 calculated from the saturation region was 7.1 cm$^2$/Vs, and the threshold electric voltage was 0 V.

Example 2

(Evaluation of Second Film)

Using the same method as in Example 1, an oxide semiconductor compound including Ga and Zn as cations was deposited, and characteristics thereof were evaluated.

However, in Example 2, when the pellets for pulsed laser deposition were prepared, $Ga_2O_3$ powder (by Kojundo Chemical Laboratory Co., Ltd.) and ZnO powder (by Kojundo Chemical Laboratory Co., Ltd.) were weighted so that a cation atomic percent ratio was Ga:Zn=35:65, and the powders were mixed. The other conditions for preparing pellets are the same as the case of Example 1. According to the above-described processes, second pellets were obtained.

By using the second pellets, under the same condition as in the case of Example 1, by the pulsed laser deposition method, a thin film was deposited on the glass substrate and the quartz glass substrate. Afterwards, the respective substrates were annealed under the aforementioned condition.

According to the above-described processes, on the two kinds of substrates, oxide films containing Ga and Zn, with a thickness of 150 nm were formed. In the following, the glass substrate having the oxide film will be referred to as a "second glass substrate sample" and the quartz glass substrate having the oxide film will be referred to as a "second quartz glass substrate sample".

Using the second glass substrate sample, a ratio between Ga and Zn in the oxide film was evaluated by the fluorescent X-ray analysis. The results of evaluation showed that the ratio between Ga and Zn was the same as the composition of the second pellets. That is, the composition of the oxide film was Ga:Zn=35:65 (in atomic ratio). In the following, the film obtained in the aforementioned deposition method will be referred to as a "second film". Note that the composition of the second film is expressed by $Ga_{0.35}Zn_{0.65}O_y$.

Next, a crystallinity of the second film was evaluated using the same method as in Example 1.

Figure 20:
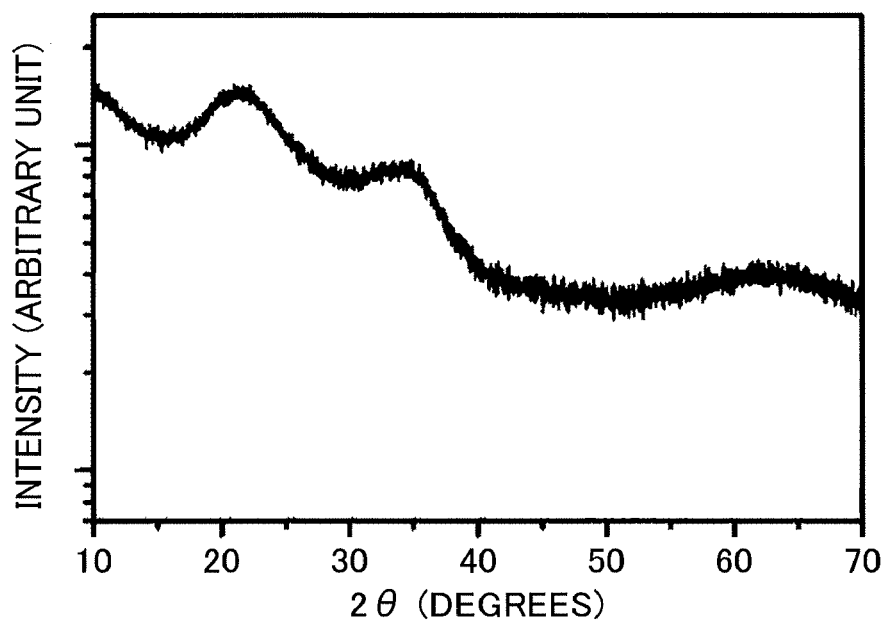
FIG. 20 is a chart showing a result of an X-ray diffraction measurement obtained for a second glass substrate sample.

FIG. 20 shows results of an X-ray diffraction measurement obtained for the second glass substrate sample. From the results it is found that in the second glass substrate sample, only a broad halo pattern is present. The Scherrer diameter obtained from the aforementioned formula (3) was 1.3 nm, and it was identified that the second film was amorphous.

Next, from the aforementioned formula (5), an absorption coefficient of the second film was evaluated. FIG. 12 shows the absorption coefficient of the second film. The absorption coefficient of the second film for the incident light energy of 3.5 eV was 3062 $cm^{-1}$. Moreover, from the formula (6), an optical band gap of the second film was evaluated. As a result, the optical band gap of the second film was calculated to be 3.47 eV.

Next, by a Hall measurement for the second quartz glass substrate sample, a carrier density and a mobility of the second film were evaluated. The method of the Hall measurement was the same as in Example 1.

Figure 21:
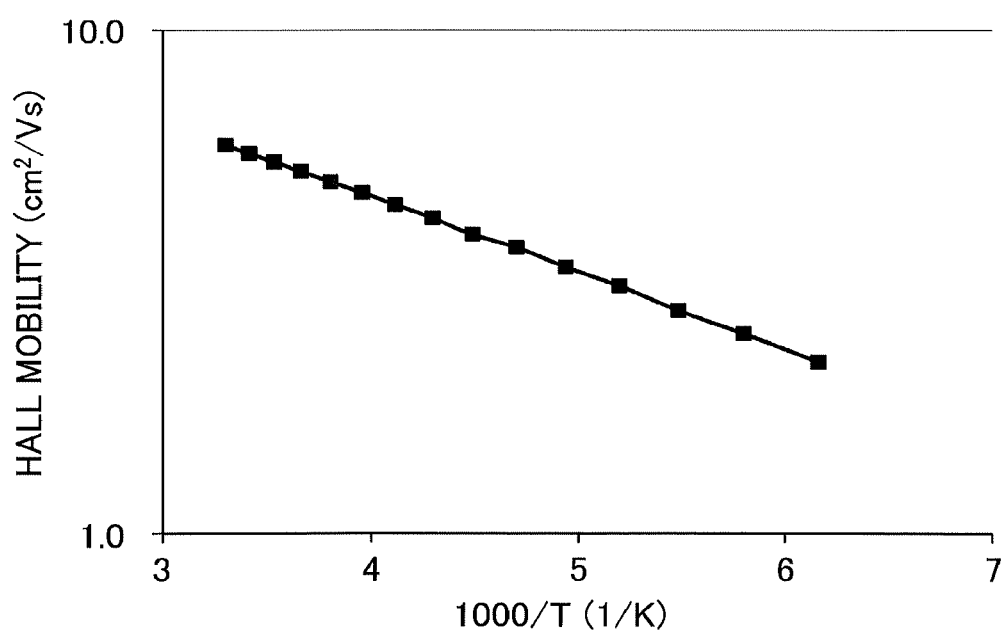
FIG. 21 is a graph showing a temperature dependence of a mobility obtained from the Hall measurement for the second film in Example 2.
Figure 22:
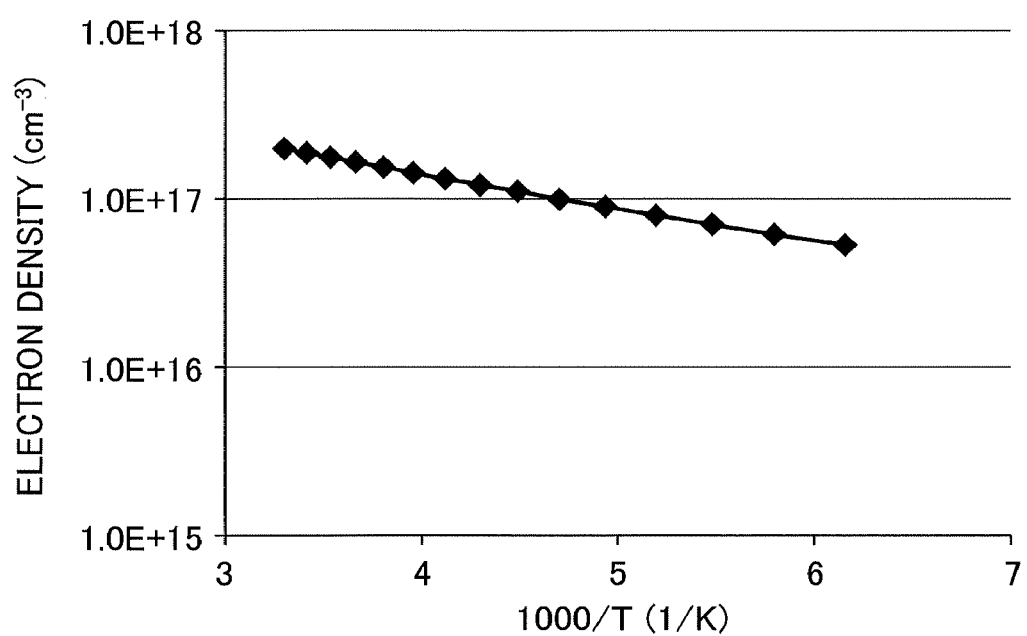
FIG. 22 is a graph showing a temperature dependence of a carrier density obtained from the Hall measurement for the second film in Example 2.

FIG. 21 shows a temperature dependence of the mobility obtained by the Hall measurement. Moreover, FIG. 22 shows a temperature dependence of the carrier density obtained by the Hall measurement. Note that in any case, the carrier was an electron.

From FIG. 21 and FIG. 22, it was found that both carrier (electron) mobility and the carrier (electron) density closely followed the Arrhenius Law. The carrier (electron) mobility at 300 K was 5.9 $cm^2/Vs$.

From the temperature dependence of the carrier (electron) density N, obtained as above, based on the aforementioned formula (1), $N_0$ and the activation energy $E_a$ were obtained. $N_0$ was $1.0 \times 10^{18}$ $cm^{-3}$, and the activation energy was $E_a$=0.04 eV.

Moreover, using Smartlab by Rigaku Corporation, by an XRR method, a film density of the second film was measured. As a result, the film density was 5.25 $g/cm^3$.

(Preparation of Second TFT Sample)

Next, by the same method as in Example 1, a TFT element (in the following, referred to as a "second TFT sample") was prepared. However, in Example 2, for the oxide semiconductor layer, the second film was used. The deposition method for the film was described in the aforementioned section of "Evaluation of second film".

(Evaluation of Second TFT Sample)

Using the second TFT sample, a characteristic evaluation under the negative electric voltage application light irradiation environment was performed, as in the case in Example 1.

Figure 23:
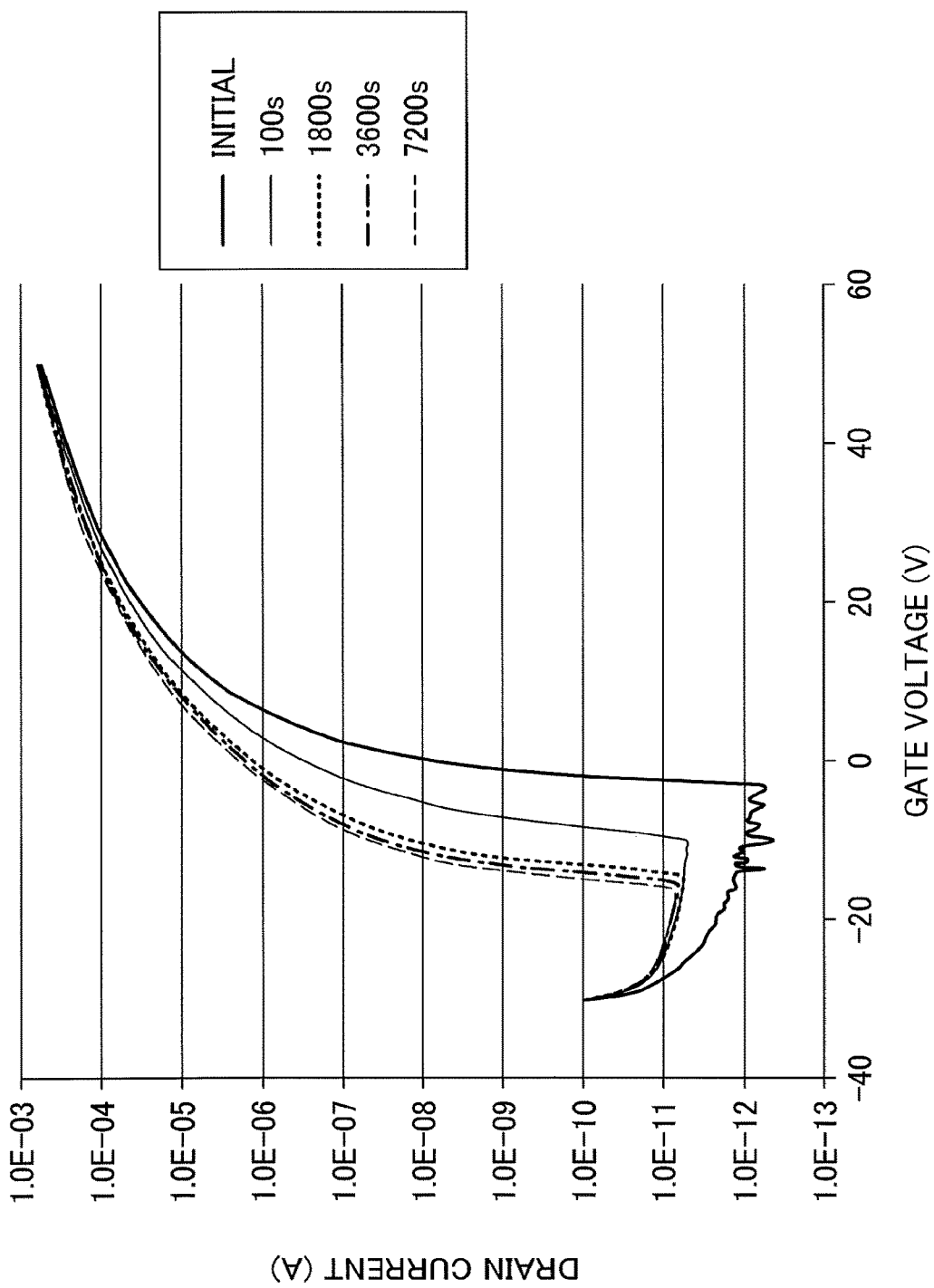
FIG. 23 is a diagram showing a result of characterization under irradiation with light from the white LED light source, obtained for a second TFT element.

FIG. 23 shows results of evaluation obtained for the second TFT sample. For a light source, a white LED light having the spectrum intensity, as shown in FIG. 16, was used. Note that in FIG. 23, a line denoted by "INITIAL" indicates a measurement result for the dark state, i.e. a state without the irradiation with light.

From FIG. 23, it is found that, in the case of the second TFT sample that is provided with the second film as the oxide semiconductor layer, the threshold electric voltage shifts, and the OFF electric current increases slightly. However, because the threshold electric current converges at about −5 V, when the gate off electric voltage is set to −25 V, for example, the second TFT sample can be used as a switching element even under the light irradiation environment.

In this way, it is confirmed that the characteristics of the second film having a composition expressed by $Ga_{0.35}Zn_{0.65}O_y$, are significantly prevented from fluctuating even under the negative electric voltage application light irradiation environment.

Note that the ON/OFF ratio of the second TFT sample in the dark state was $10^9$, the field effect mobility of the oxide semiconductor layer calculated from a saturation region was 5.5 $cm^2/Vs$, and the threshold electric voltage was −1.1 V.

Example 3

(Evaluation of Third Film)

Using the following method, an oxide semiconductor compound including Ga and Zn as cations was deposited, and characteristics thereof were evaluated. For the deposition method, a sputtering method was employed. For the target, an oxide target, of which the molar ratio between $Ga_2O_3$ and ZnO was $Ga_2O_3$:ZnO=50:50, was purchased from Toshima Manufacturing Co., Ltd.

Using the target, by the sputtering method, a thin film was deposited on a substrate. The substrate was a glass substrate and a quartz glass substrate.

The deposition was performed for the substrate and the target arranged in a vacuum chamber by the sputtering method. For a sputter power source, a radio-frequency (RF) power supply of 13.56 MHz was used. An atmosphere was a mixed gas atmosphere of an Ar gas and an $O_2$ gas. A flow rate of the Ar gas was 39.9 sccm and a flow rate of the $O_2$ gas was 0.1 sccm. A pressure was 1 Pa, and an electric power was 150 W. Furthermore, a distance between the substrate and the target was 100 mm.

According to the above-described process, on each of the two kinds of substrates, an oxide film containing Ga and Zn was formed. In the following, the glass substrate having the oxide film will be referred to as a "third glass substrate sample", and the quartz glass substrate having the oxide film will be referred to as a "third quartz glass substrate sample".

Note that a thickness of the oxide film on the third glass substrate sample was 200 nm. On the other hand, a thickness of the oxide film on the third quartz glass substrate sample was 50 nm.

In order to examine a ratio between Ga and Zn in the oxide film obtained as above, by the same method as in the case of Example 1, a fluorescent X-ray analysis was performed.

As a result of the analysis, a molar ratio of Ga/(Zn+Ga) was 65%. That is, the composition of the oxide film was Ga:Zn=65:35 (atomic ratio). In the following, the oxide film obtained by the aforementioned deposition method will be referred to as a "third film". Note that the composition of the third film is expressed by $Ga_{0.65}Zn_{0.33}O_z$.

Next, from the aforementioned formula (6), an optical band gap of the third film was evaluated. As a result, the optical band gap of the third film was calculated to be 3.90 eV.

Moreover, the Hall mobility of the third film at 300 K was 4.82 cm$^2$/Vs.

Furthermore, using Smartlab by Rigaku Corporation, by an XRR method, a film density of the third film was measured. As a result, the film density was 5.36 g/cm$^3$.

(Preparation of Third TFT Sample)

Next, by the same method as in Example 1, a TFT element (in the following, referred to as a "third TFT sample") was prepared.

However, in Example 3, for the oxide semiconductor layer, the third film was used. The deposition method for the film was described in the aforementioned section of "Evaluation of third film". Moreover, in Example 3, the TFT element, prepared as above, was subjected to a surface treatment. The surface treatment was performed by immersing the TFT element in an aqueous solution of tetramethyl-ammoniumhydride (TMAH) of 2.38% for three seconds.

According to the above-described processes, the third TFT sample was prepared.

(Evaluation of Third TFT Sample)

Using the third TFT sample, a characteristic evaluation under the negative electric voltage application light irradiation environment was performed, as in the case in Example 1.

Figure 24:
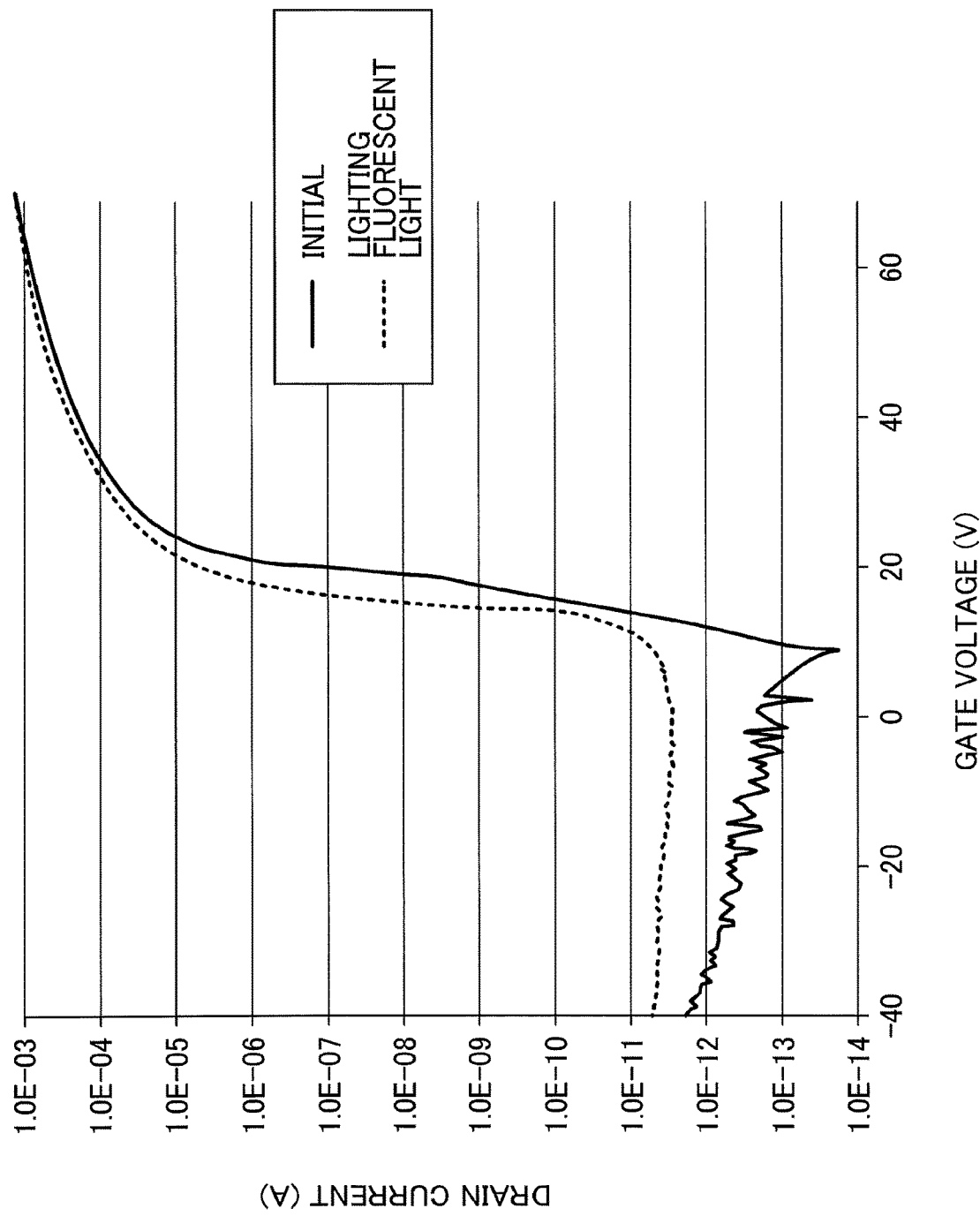
FIG. 24 is a diagram showing a result of characterization under irradiation with light from the fluorescent light, obtained for a third TFT element.

FIG. 24 shows results of the evaluation obtained for the third TFT sample. For a light source, a fluorescent light having the spectrum intensity, as shown in FIG. 17, was used. Note that in FIG. 24, a line denoted by "INITIAL" indicates a characteristic measurement result for the dark state, i.e. a state without the irradiation with light. Moreover, a line denoted by "LIGHTING FLUORESCENT LIGHT" indicates a characteristic measurement result for a state with the irradiation with light. In the latter case, the source electric voltage was 0 V, and the drain electric voltage was 40 V.

Figure 25:
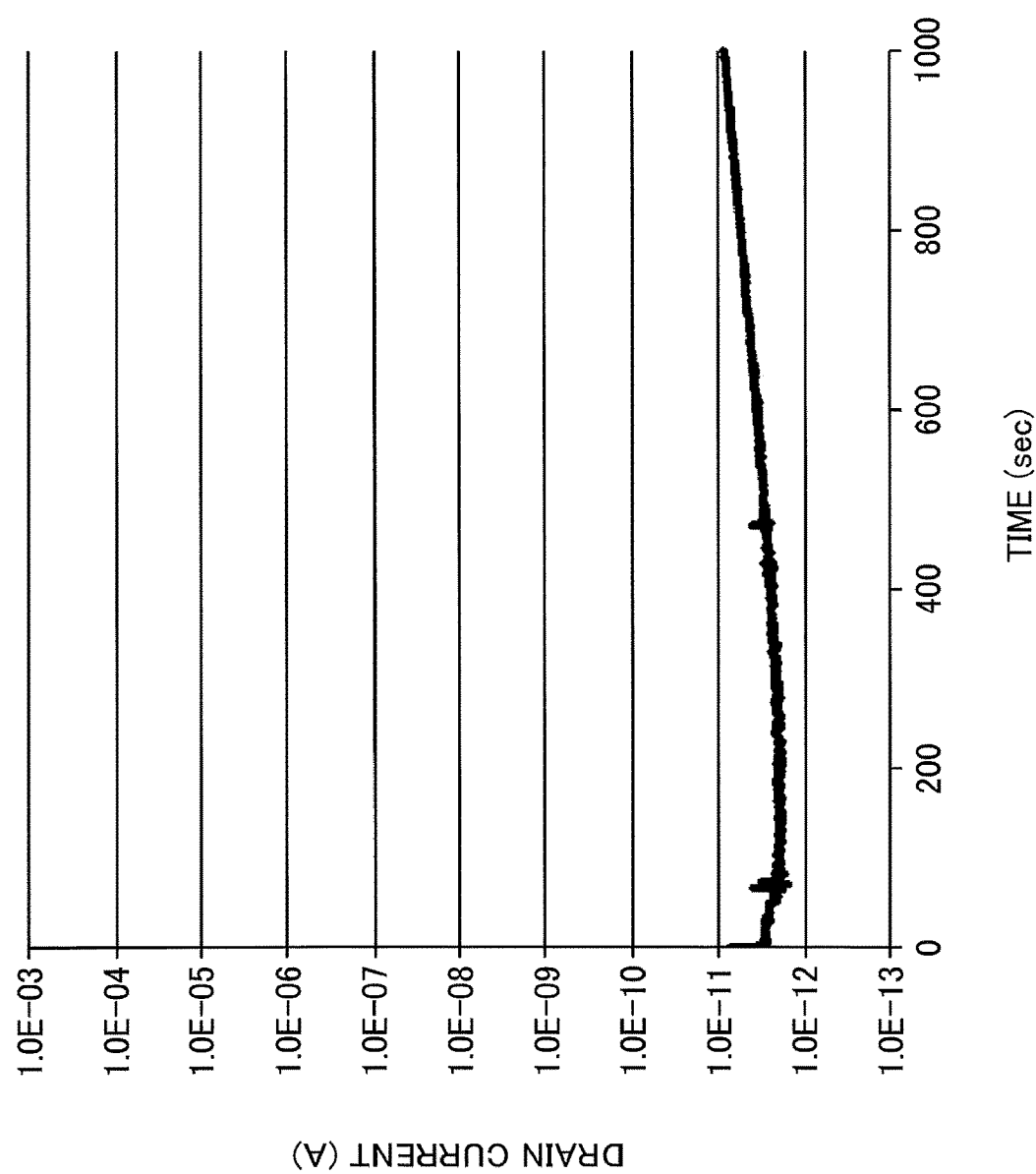
FIG. 25 is a diagram showing another result of the characterization under irradiation with light from the fluorescent light, obtained for the third TFT element.

FIG. 25 shows a chronological change in an electric current value of the third TFT sample during driving under the irradiation with light from a fluorescent light. A driving condition for the third TFT sample was that the gate electric voltage was −30 V, the drain electric voltage was 10 V, and the source electric voltage was 0 V.

From FIGS. 24 and 25, it is found that, in the case of the third TFT sample, even under the environment of irradiation with light, almost no shift of the threshold electric voltage or almost no increase of the OFF current can be observed.

In this way, it is confirmed that the characteristics of the third film having a composition expressed by $Ga_{0.65}Zn_{0.35}O_z$ are significantly prevented from fluctuating even under the negative electric voltage application light irradiation environment.

Note that the ON/OFF ratio of the third TFT sample in the dark state was 10$^{10}$, the field effect mobility of the oxide semiconductor layer calculated from a saturation region was 8.04 cm$^2$/Vs, and the threshold electric voltage was 19.0 V.

Example 4

(Evaluation of Fourth Film)

By using a method described as follows, an oxide semiconductor compound containing In, Ga and Zn as cations was deposited, and characteristics thereof were evaluated.

First, a target for sputtering was prepared.

The target was prepared as follows: $In_2O_3$ powder (by Kojundo Chemical Laboratory Co., Ltd.), $Ga_2O_3$ powder (by Kojundo Chemical Laboratory Co., Ltd.) and ZnO powder (by Kojundo Chemical Laboratory Co., Ltd.) were weighted so that a molar ratio was $In_2O_3:Ga_2O_3:ZnO=1:1:2$, and the powders were mixed in a mortar. From the mixed powder, a green compact was formed.

The green compact was baked in atmospheric air and at 1400° C. for five hours, and the target having a diameter of 76.2 mm and a height of 8 mm was obtained.

Using the target, by the sputtering method, a thin film was deposited on a substrate. For the substrate, a glass substrate and a quartz glass substrate were used.

The deposition was performed for the substrate and the target arranged in a vacuum chamber by the sputtering method. For a sputter power source, a radio-frequency (RF) power supply of 13.56 MHz was used. An atmosphere was a mixed gas atmosphere of an Ar gas and an $O_2$ gas. A flow rate of the Ar gas was 19.6 sccm and a flow rate of the $O_2$ gas was 0.4 sccm. A pressure was 0.55 Pa, and an electric power was 70 W. Furthermore, a distance between the substrate and the target was 100 mm.

After the deposition, the substrate was annealed at 300° C., for one hour, under an atmosphere of pure oxygen.

According to the above-described process, on the substrate, an oxide film containing In, Ga and Zn with a thickness of about 30 nm was formed. In the following, the glass substrate having the oxide film will be referred to as a "fourth glass substrate sample", and the quartz glass substrate having the oxide film will be referred to as a "fourth quartz glass substrate sample".

In order to examine percentages of Ga and Zn in the oxide film of the fourth glass substrate sample obtained as above, by the same method as in the case of Example 1, a fluorescent X-ray analysis was performed.

As a result of the analysis, atomic percentages of In, Ga and Zn were 40%, 36% and 24%, respectively. In the following, the oxide film obtained by the aforementioned deposition method will be referred to as a "fourth film".

From the aforementioned formula (5), an absorption coefficient of the fourth film was evaluated. FIG. 12 shows the absorption coefficient of the fourth film. The absorption coefficient of the fourth film for the incident light energy of 3.5 eV was 30023 cm$^{-1}$. Moreover, from the formula (6), an optical band gap of the fourth film was evaluated. As a result, the optical band gap of the fourth film was calculated to be 3.1 eV.

Next, by a Hall measurement for the fourth quartz glass substrate sample, a carrier density and a mobility of the fourth film were evaluated. The method of the Hall measurement was the same as in Example 1.

The results of measurement showed that the carrier was an electron, and that both the carrier (electron) mobility and the carrier (electron) density closely followed the Arrhenius Law. The activation energy $E_a$ calculated based on the aforementioned formula (1) was 0.05 eV, and $N_0$ was 8.0× 10$^{15}$ cm$^{-3}$. Moreover, the carrier (electron) mobility at 300 K was 5.9 cm$^2$/Vs.

(Preparation of Fourth TFT Sample)

Next, by the same method as in Example 3, a TFT element (in the following, referred to as a "fourth TFT sample") was prepared.

However, in Example 4, for the oxide semiconductor layer, the fourth film was used. The deposition method for the film was described in the aforementioned section of "Evaluation of fourth film".

(Evaluation of Fourth TFT Sample)

Using the fourth TFT sample, a characteristic evaluation under the negative electric voltage application light irradiation environment was performed, as in the case in Example 1.

FIGS. 26 and 27 show results of the evaluation obtained for the fourth TFT sample. FIG. 26 shows results of the evaluation under irradiation with light from a white LED light source, and FIG. 27 shows results of the evaluation under irradiation with light from a fluorescent light.

Note that in FIGS. 26 and 27, lines denoted by "INITIAL" indicate characteristic measurement results for the dark state, i.e. a state without the irradiation with light.

From FIGS. 26 and 27, it is found that, in the case of the fourth TFT sample that is provided with the fourth film as the oxide semiconductor layer, under the negative electric voltage application light irradiation environment, and independent of a type of the light source, the characteristics fluctuate significantly.

Particularly, in the case of using the white LED light source for the light source, it was found from FIG. 26 that a leak current from the fourth TFT sample exceeds 100 pA under the negative electric voltage application light irradiation environment. Additionally, in the case of using the fluorescent light for the light source, it was found from FIG. 27 that an amount of shift of the threshold electric voltage and the leak current were greater than those in the case of using the white LED light source for the light source, and thereby the characteristics were further degraded.

In this way, it was found that in the fourth TFT sample, which did not have the oxide semiconductor layer according to the embodiment of the present invention, the characteristics were degraded significantly, under the negative electric voltage application light irradiation environment. In contrast, it was found that in the TFT element, which was provided with the oxide semiconductor layer according to the embodiment of the present invention (first to third TFT samples), the characteristics were prevented from being significantly degraded under the negative electric voltage application light irradiation environment.

REFERENCE SIGNS LIST

100 TFT (first element)
110 substrate
120 barrier film
130 oxide semiconductor layer
132 protrusion part
138 insulation film
140 gate insulation film
150 interlayer insulation film
160 first electrode
162 second electrode
168 conductive film
170 gate electrode
180 passivation film
200 photovoltaic cell (second element)
210 support
220 silicon layer
230 oxide semiconductor layer
240 electrode layer
300 OLED (third element)
310 substrate
320 first electrode (cathode)
330 oxide semiconductor layer
340 organic layer
350 second electrode (anode)
400 first TFT sample
410 silicon substrate
420 thermal oxidation film
430 oxide semiconductor layer
440 drain electrode
450 source electrode

What is claimed is:

1. An oxide semiconductor compound comprising:
gallium; and
oxygen,
wherein the oxide semiconductor compound does not contain indium,
wherein an optical band gap is 3.4 eV or more,
wherein an electron Hall mobility obtained by performing a Hall measurement at a temperature of 300 K is 3 cm$^2$/Vs or more, and
wherein the oxide semiconductor compound is an amorphous material having a crystallite diameter L being 6 nm or less, obtained by Scherrer's formula shown below:

$$L = K\lambda/(\beta \cos \theta)$$

where K is a Scherrer constant, $\lambda$ is a wavelength of X-ray, $\beta$ is a half width, and $\theta$ is a peak position.

2. The oxide semiconductor compound according to claim 1,
wherein when a temperature dependence of an electron density N obtained from the Hall measurement is expressed by a formula:

$$N = N_0 \exp(-E_a/kT), \qquad \text{formula (1)}$$

where T is a measurement temperature (K), k is Boltzmann constant (eVK$^{-1}$), and $E_a$ is an activation energy (eV),
$N_0$ is $10^{16}$ cm$^{-3}$ or more.

3. The oxide semiconductor compound according to claim 2, wherein the activation energy Ea is 0.04 eV or more.

4. The oxide semiconductor compound according to claim 1, further comprising zinc.

5. The oxide semiconductor compound according to claim 1, wherein an atomic ratio of gallium atoms to an entirety of metallic cations is 35% or more.

6. The oxide semiconductor compound according to claim 1, consisting essentially of gallium oxide and zinc oxide.

7. The oxide semiconductor compound according to claim 6, wherein an atomic ratio of gallium atoms to a whole amount of gallium atoms and zinc atoms falls within a range from 35% to 95%.

8. A semiconductor element comprising a layer of an oxide semiconductor compound,
wherein the semiconductor element is any one of a thin film transistor (TFT), a photovoltaic cell, and an organic light emitting diode (OLED), and
wherein the layer is configured of the oxide semiconductor compound according to claim 1.

9. The semiconductor element according to claim 8,
wherein the semiconductor element is a TFT, and
wherein the layer has a field effect mobility of 5 cm$^2$/Vs or more.

10. A semiconductor element comprising a layer of an oxide semiconductor compound, wherein the semiconductor element is a thin film transistor (TFT), and
wherein the layer includes gallium and oxygen, has an optical band gap of 3.4 eV or more, and has a field effect mobility of 5 cm$^2$/Vs or more,
wherein the layer does not include indium.

11. The semiconductor element according to claim 8, wherein the semiconductor element comprises:
a substrate;
the layer arranged above the substrate;
a gate electrode arranged above the layer; and a source electrode and a drain electrode being in contact with the layer, and wherein the layer is not shielded by a light shielding layer on a side of the substrate.

12. The semiconductor element according to claim 8, wherein the semiconductor element comprises:

a substrate;

a gate electrode arranged above the substrate;

the layer arranged above the gate electrode; and a source electrode and a drain electrode being in contact with the layer, and wherein the layer is not shielded by a light shielding layer on a side opposite to the substrate and the gate electrode.

13. A laminated body comprising:

a substrate; and a layer of an oxide semiconductor compound arranged above the substrate, wherein the layer is configured of the oxide semiconductor compound according to claim 1.

14. The laminated body according to claim 13, further comprising a barrier film between the substrate and the layer.

15. The laminated body according to claim 13, wherein the substrate is a glass substrate.

16. The oxide semiconductor compound according to claim 1, consisting of gallium oxide and zinc oxide.

17. The oxide semiconductor compound according to claim 16, wherein an atomic ratio of gallium atoms to a whole amount of gallium atoms and zinc atoms falls within a range from 35% to 95%.

18. The oxide semiconductor compound according to claim 1, wherein an absorption coefficient for an incident light energy of 3.5 eV is 10,000 $cm^{-1}$ or less.

* * * * *